United States Patent
Kozuka et al.

(10) Patent No.: US 6,590,242 B1
(45) Date of Patent: Jul. 8, 2003

(54) LIGHT-RECEIVING ELEMENT AND PHOTOELECTRIC CONVERSION DEVICE

(75) Inventors: Hiraku Kozuka, Hiratsuka (JP); Toru Koizumi, Yokohama (JP); Koji Sawada, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/512,031

(22) Filed: Feb. 24, 2000

(30) Foreign Application Priority Data

| Feb. 25, 1999 | (JP) | ............................................. | 11-049062 |
| Feb. 25, 1999 | (JP) | ............................................. | 11-049063 |
| Feb. 25, 1999 | (JP) | ............................................. | 11-049064 |
| Feb. 25, 1999 | (JP) | ............................................. | 11-049190 |
| Feb. 25, 1999 | (JP) | ............................................. | 11-049209 |

(51) Int. Cl.[7] ............................................. H01L 31/068
(52) U.S. Cl. ........................ 257/292; 257/464; 257/465
(58) Field of Search ................................. 257/292, 464, 257/465

(56) References Cited

U.S. PATENT DOCUMENTS 5,563,429 A * 10/1996 Isogai .......................... 257/292
5,903,021 A * 5/1999 Lee et al. .................... 257/292

FOREIGN PATENT DOCUMENTS

| JP | 55-154784 | 12/1980 |
| JP | 61-264758 | 11/1986 |
| JP | 1-303752 | 12/1989 |
| JP | 9-205588 | 8/1997 |

* cited by examiner

Primary Examiner—Jerome Jackson
(74) Attorney, Agent, or Firm—Fitzpatrick, Cella, Harper & Scinto

(57) ABSTRACT

In order to reduce the capacitance of a light-receiving element, the present invention provides a light-receiving element comprises a first semiconductor region of the first conductivity type, a second semiconductor region of the second conductivity type, provided on the first semiconductor region, a third semiconductor region of the first conductivity type, provided between the second semiconductor region and an insulating film and an electrode region of the second conductivity type, provided in the second semiconductor region where the third semiconductor region is absent on and above the second semiconductor region, and connected to an anode or cathode electrode consisting of a conductor.

31 Claims, 29 Drawing Sheets

LIGHT-RECEIVING ELEMENT AND PHOTOELECTRIC CONVERSION DEVICE

BACKGROUND OF THE INVENTION

1. Field of the Invention

The present invention relates to a light-receiving element of an image sensor used for such an image-reading system as a digital camera, an image scanner, a facsimile, a copying machine, etc., as well as a photoelectric conversion device comprising the light-receiving element, specifically to the structure of a light-receiving element suitable for a photoelectric conversion device such as a close contact type image sensor, which is provided with a comparatively large light-receiving element having the opening portion of a pixel with several tens microns or more in size.

2. Related Background Art

In recent years, CCD image sensors, non-CCD image sensors such as CMOS image sensors, etc. have been positively developed as photoelectric conversion devices.

Generally, a photodiode comprising a PN junction of a semiconductor is used for light-receiving elements of these photoelectric conversion devices.

Prior Art (1)

For example, as disclosed by Japanese Patent Application Laid-Open No. 55-154784, there is proposed a structure of a light-receiving element in which the surface of a substrate where no PN junction is formed has a region having the same conductivity type as that of the substrate and a larger impurity concentration than that of the substrate, thereby reducing the dark current to be generated on the surface of the substrate.

FIGS. 29A and 29B show a structure of a conventional light-receiving element. Numeral 201 indicates an n-type semiconductor substrate; 202: a p-type semiconductor layer; 203: an n-type semiconductor layer having an impurity concentration of $5 \times 10^{15}$ cm$^{-3}$ to $10 \times 10^{15}$ cm$^{-3}$ and a thickness of 0.2 μm to 0.3 μm; 205: a thermal oxide film; 208: an n$^+$ channel stopper; 209: an anti-reflection coating film consisting of nitride; 215 and 216: aluminum electrodes; 228: an n$^+$-type semiconductor layer; and 238: a surface electrode. Symbol DL indicates a depletion layer; and DLS: a surface side portion of the depletion layer.

The anode of a photodiode is formed only with a p-type semiconductor layer 202. When the impurity concentration is lowered, therefore, the property of the ohmic contact with the electrode 215 is degraded. On the contrary, when the impurity concentration is increased, the depletion layer DL is not extended into the semiconductor layer 202.

Prior Art (2)

As disclosed by Japanese Patent Application Laid-Open No. 61-264758, there is proposed a light-receiving element in which the junction capacitance formed by the PN junction is reduced, as the light-receiving element for a one-dimensional photoelectric conversion device.

FIG. 30 shows a top view of a conventional photoelectric conversion device such as a CCD image sensor. Numeral 301 indicates a p-type substrate and numeral 302 indicates an n$^+$-type accumulating portion. A portion surrounded by the n$^+$-type accumulating portion 302 on the p-type substrate 301 is a p-type photoelectric conversion region functioning as a pixel. Symbol PG indicates a photo-gate; SG: a shift-gate; and SR: a CCD shift-register.

In this structure, the PN junction area is reduced, but the PN junction periphery length is increased. It is therefore impossible to sufficiently reduce the capacitance of the PN junction, whereby the sensitivity cannot be increased so much.

Prior Art (3)

For example, as disclosed by Japanese Patent Application Laid-Open No. 1-303752, there is proposed a structure of a photosensitive portion used for a close contact type image sensor, which is intended to reduce the dark current to be caused by the scribe at the end of the chip in the structure of the photosensitive portion.

FIG. 31 shows a cross-sectional view of a light-receiving element of prior art. In FIG. 31, numeral 301 indicates a P-type semiconductor region; 302: an N-type semiconductor region; 303: a P-type shallow channel stop layer; 305: a field oxide film; 306: a P-type substrate; 308: a P-type channel stop layer; 309: an interlayered insulating film; 317: a light-shielding film for forming an opening portion (OP). A depletion layer (DL) is extended into the P-type semiconductor region 301, whereby electrons of the generated photocarriers (PC) are collected in the N-type semiconductor region 302 by to an internal magnetic field.

Prior Art (4)

For example, as disclosed by Japanese Patent Application Laid-Open No. 64-14958, a photodiode having a cross-sectional structure of N-type substrate/P-type region/N-type region/P-type region is generally used as a light-receiving element of a CCD image sensor.

FIG. 32 shows a cross-sectional view of a light-receiving element of prior art. In FIG. 32, numeral 406 indicates an N-type substrate; 401: a P-type semiconductor region; 402: an N-type semiconductor region; 403: a shallow P-type semiconductor layer; 408: a P$^+$-type channel stop layer; 409: an insulating film; 415: an electrode consisting of polysilicon; and 420: an N-type region of a CCD register.

Prior Art (5)

On the other hand, a photoelectric conversion device employing a light-receiving element is proposed, for example, in Japanese Patent Application Laid-Open No. 9-205588, which uses a photodiode as a light-receiving element and reads the electric charges of the light-receiving element at a time with use of a source follower amplifier by providing this light-receiving element with an electrode and connecting it to the gate electrode of an MOS transistor.

However, when a light-receiving element is employed for an amplifying type photoelectric conversion device which accumulates photo-generated carriers and reads out a signal voltage from a PN photodiode by using charge-voltage conversion means, the sensitivity of the photoelectric conversion device may be degraded in some cases.

For such an amplifying type photoelectric conversion device, the light output is represented by the following formula (1):

$$Vp = Qp/Cs \qquad (1)$$

wherein Qp is the quantity of a charge accumulated in the PN photodiode and Cs is a capacitance of the photodiode.

The capacitance Cs of this photodiode can be represented by the formula (2) as shown below, for example, for an amplifying type photoelectric conversion device having a pixel in which an MOS source follower or a reset MOS transistor is connected to a photodiode:

$$Cs = Cpd + Ca \qquad (2)$$

Wherein Cpd is a PN junction capacitance of the PN photodiode itself including a light-receiving portion, Ca is the other capacitance of portions connected to the photodiode, and in the above case the other capacitance includes the gate capacitance of the MOS transistor consti-tuting the MOS source follower, the capacitance of the junction between the source and the well of the reset MOS transistor, the overlapping capacitance of the source and the gate, the wiring capacitance, and the like.

Consequently, to realize high sensitivity, it is indispensable that the photo-generated carriers are effectively accumulated and the capacitance of the photodiode for accumulating the carriers is reduced as much as possible.

On the other hand, when light is made incident in the photodiode, electric charges generate in the photodiode and electric charges in and around the depletion layer formed due to a PN junction surface in the semiconductor substrate gather at an anode or a cathode. In this case, when an electrode is attached to this anode or cathode, the electric charges can be taken out as electric signals.

Prior Art (6)

FIG. 33 is a cross-sectional view of a light-receiving element of prior art provided with an electrode. In FIG. 33, numeral 701 indicates a first semiconductor region, and numeral 702 indicates a second semiconductor region to be used as an anode. The conductivity types of those regions are N-type and P-type, respectively. In addition, symbol DL is a depletion layer formed by a PN junction between the first semiconductor region 701 and the second conductor region 702. Although not illustrated in FIG. 33, a reverse bias is applied to between the first semiconductor region 701 and the second semiconductor region 702. In addition, numeral 715 indicates an electrode, which is connected to the second semiconductor region 702 through a contact hole CH of the insulating film 709.

The electrode 715 is composed of a metal, for example, Al as a main component. The electrode 715 is connected to an electrode region formed on the major surface of the semiconductor substrate through a contact hole CH of the insulating film covering the surface of the photodiode. Generally, such light-receiving element is composed by connecting a conductive material such as Al to a semiconductor region so as to obtain photosignals generated by photocarriers photoelectric-converted in the semiconductor region.

For example, when a general RIE (reactive ion etching) method is employed to form this electrode, then over-etching is usually conducted so as to remove unnecessary portions. In this over-etching, however, some ions accelerated by an electrical field pass through the insulating film 709 and reach the major surface of the semiconductor substrate and then damage the vicinity of the interface between the semiconductor and the insulating film, thereby resulting in generation of crystal defects in some cases.

Crystal defects may also generate due to the plasma ashing of a photoresist, etc. even in a step after the electrode is formed, just like in the above case.

In the case of a general light-receiving element, a PN junction exists around a semiconductor region formed on the major surface of the semiconductor substrate to which an electrode is connected and the junction surface reaches the vicinity of the interface between the major surface of the semiconductor substrate and the insulating film in many cases.

Consequently, when an electrode is formed at an inner portion from the junction surface reaching the major surface of the semiconductor substrate, crystal defects due to etching damage generate in the vicinity of the junction surface, and the crystal defects become centers for causing carriers to be generated. The crystal defects generated at a portion of the depletion layer cause a dark current to be generated.

The generated dark current as described above also becomes a factor for causing the dark current to be varied, since the quantity of the crystal defects generated in the vicinity of the interface or the quantity of crystal defects themselves is changed by misalignment of a mask in formation of electrodes, etc. and etching conditions.

SUMMARY OF THE INVENTION

The first object of the present invention is to provide a light-receiving element capable of reducing the capacitance of the PN junction of the photodiode portion as much as possible and more effectively utilizing the photo-generated carriers.

The second object of the present invention is to provide a light-receiving element capable of suppressing generation of crystal defects in a semiconductor region where a depletion layer is formed.

(1) The light-receiving element of the present invention comprises:
- a first semiconductor region (1, 11, 21, 31, 81) of the first conductivity type;
- a second semiconductor region (2, 12, 32, 82) of the second conductivity type, provided on the first semiconductor region;
- a third semiconductor region (3, 13, 33, 83) of the first conductivity type, provided between the second semiconductor region and an insulating film;
- an electrode region (4, 14, 34, 84) of the second conductivity type, provided in the second semiconductor region where the third semiconductor region is absent on and above the second semiconductor region, and connected to an anode or cathode electrode consisting of a conductor.

Each portion of the light-receiving element may preferably be designed as follows.

The electrode region may be set in a floating state to accumulate photo-generated electric charges; and a bias voltage may be applied to the first semiconductor region so as to apply a reverse bias between the first semiconductor region and the second semiconductor region.

The second semiconductor region provided under the third semiconductor region may be fully depleted, thereby reducing the capacitance.

The electrode region may be shielded from light by the anode or cathode electrode.

A potential slope for moving the photo-generated electric charges towards the electrode region may be formed between the electrode region and the second semiconductor region.

The potential slope for moving the photo-generated electric charges towards the second semiconductor region may be formed between the third semiconductor region and the second semiconductor region and between the first semiconductor region and the second semiconductor region.

The anode or cathode electrode may be connected to the gate of the transistor (M2) of a read circuit.

An internal region (22) of the second conductivity type may be formed inside the second semiconductor region. The internal region (22) has an impurity concentration higher than that of the second semiconductor region and lower than that of the electrode region.

The internal region (22) may consist of a plurality of portions, the portions having an impurity concentration different from each other.

The internal region (22) may be formed so as to enclose the electrode region.

The internal region (22) may be formed so as to be unevenly distributed in an opening portion (OP) formed in a light-shielding film (17).

The internal region (22) may include a region (22A) having a decreased width as the internal region goes away from the electrode region so as to improve the carriers-collecting efficiency.

Each corner of the region (22A) having the decreased width may have an obtuse angle.

The internal region (22) may be extended from the electrode region distributed unevenly in the opening portion formed in the light-shielding film over the center of the opening portion.

The internal region (22) may be formed at a shallower position than the second semiconductor region.

The second semiconductor region may be formed apart from the insulating film for element separation.

The third semiconductor region may be formed apart from the electrode region.

The third semiconductor region may be formed so as to enclose the electrode region.

Each corner of the second semiconductor region may have an obtuse angle.

The electrode region may be provided so as to be distributed unevenly at one end inside the opening portion formed in the light-shielding film, and a contact for applying a voltage to the first semiconductor region therethrough may be provided at the other end inside the opening portion.

A potential slope may be formed in the second semiconductor region from the one end to the other end inside the opening portion.

Each corner of the second semiconductor region may have an obtuse angle, and each corner of the internal region (22) formed in the second semiconductor region may have an obtuse angle.

A doped region (43) having a low impurity concentration may be formed between the third semiconductor region and the electrode region.

An anode or cathode electrode may be formed on or above the doped region.

The anode or cathode electrode may be provided to extend on or above an offset region formed between the third semiconductor region and the electrode region.

The anode or cathode electrode may be provided to extend on or above the interface between the depletion region (DL) formed in the vicinity of the electrode region and the insulating film (9).

The top surface of the second semiconductor region may be covered with the anode or cathode electrode and the third semiconductor region.

The anode or cathode electrode may be connected to the gate of a transistor of the read circuit and the source or drain of a transistor of the reset circuit.

The first semiconductor region may be formed from any one of a semiconductor substrate, an epitaxial layer formed on the semiconductor substrate, and a well formed in the semiconductor substrate.

(2) The light-receiving element of the present invention also comprises:
  a first semiconductor region (51, 61, 71, 81) of the first conductivity type;
  a second semiconductor region (52, 62, 72, 82) of the second conductivity type, provided on the first semiconductor region;
  a third semiconductor region (53, 63, 73, 83) of the first conductivity type, provided between the surface of a semiconductor substrate including the first and second semiconductor regions and an insulating film (9) adjacent to the surface of the semiconductor substrate; and
  an anode or cathode electrode (15) consisting of a conductor, the anode or cathode being connected to the second semiconductor region,
  wherein the anode or cathode electrode has an extended portion covering an upper part of a portion (59, 69, 89) where the depletion layer (DL) formed between the second semiconductor region and the third semiconductor region is in contact with the insulating film.

Each of the light-receiving element of the present invention may preferably be designed as follows.

The first semiconductor region may be composed of an epitaxial layer, the second semiconductor region may be formed at the top surface inside of the first semiconductor region, and the top surface area of the anode or cathode electrode may be made larger than the top surface area of the second semiconductor region.

The second semiconductor region may be composed of a plurality of portions having an impurity concentration different from each other, and the top surface area of the anode or cathode electrode may be made larger than the top surface area of the second semiconductor region.

The second semiconductor region may be composed of a portion having a high impurity concentration and a portion having a low impurity concentration, and the third semiconductor region may be formed on the top surface of the portion having the low impurity concentration.

The extended portion of the anode or cathode electrode may cover at least a portion on or above the third semiconductor region.

The photoelectric conversion device of the present invention may be obtained by combining those light-receiving elements as described above, a light source such as an LED, and an imaging element.

DETAILED DESCRIPTION OF THE PREFERRED EMBODIMENTS

Embodiment 1

Now, referring to FIGS. 1A to 1D, FIG. 2 and FIG. 3, the first embodiment of the present invention as a basic embodiment will be described below.

Figure 1A:
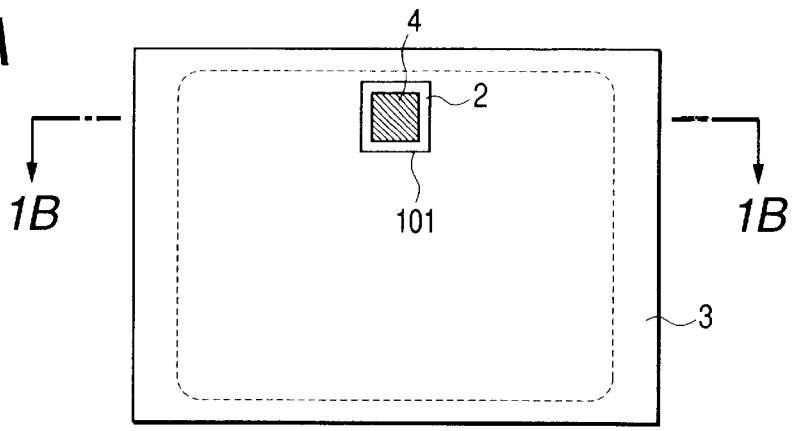
FIG. 1A is a top view of a light-receiving element according to an embodiment of the present invention.
Figure 1B:
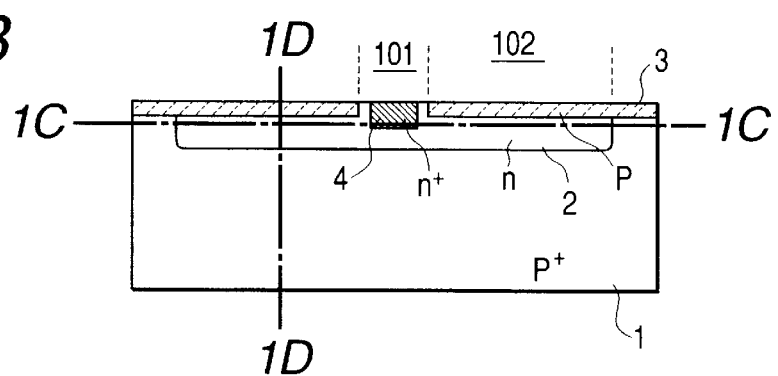
FIG. 1B is a cross-sectional view of the light-receiving element according to the embodiment of the present invention.
Figure 1C:
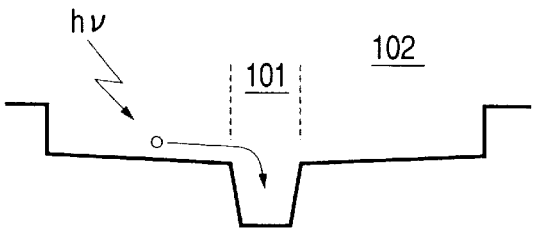
FIG. 1C is a schematic diagram showing a potential profile in the horizontal direction of the light-receiving element according to the embodiment of the present invention.
Figure 1D:
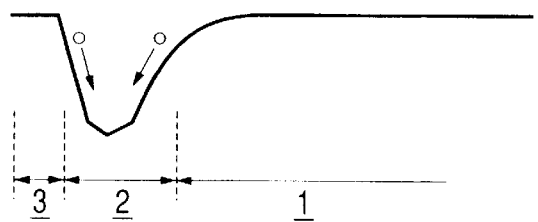
FIG. 1D is a schematic diagram showing a potential profile in the vertical direction of the light-receiving element according to the embodiment of the present invention.

FIGS. 1A to 1D show most properly the characteristics of the first embodiment. FIG. 1A is a top view of a light-receiving element part in the first embodiment. FIG. 1B is a sectional view taken in the line 1B—1B of FIG. 1A. FIG. 1C is a potential profile view taken in the line 1C—1C of FIG. 1B. FIG. 1D is a potential profile view taken in the line 1D—1D of FIG. 1B.

In the drawings, numerals 1, 2 and 3 respectively denote a first semiconductor region of a first conductivity type provided in a semiconductor substrate, a second semiconductor region of a second conductivity type provided in the first semiconductor region 1, and a third semiconductor region of the first conductivity type provided in the major surface side of the second semiconductor region 2.

Numeral 4 denotes an electrode region provided adjacent to the second semiconductor region 2 to take out electric charges generated by light (hereinafter referred to as "photo-generated electric charges"). More specifically, the electrode region 4 is composed of a high impurity concentration region having the same conductivity type as that of the second semiconductor region 2 and having an impurity concentration higher than that of the second semiconductor region, or the like.

Numeral 102 denotes a light-receiving region 102 composed of the first, second and third semiconductor regions 1, 2 and 3. Carriers generated in the region 102 by light incidence are captured in a region 101. Needless to say, when the light is incident on the region 101, the carriers will be generated in this region 101.

In the drawings, the first conductivity type is shown as a p-type and the second conductivity type is shown as an n-type. However, according to the present invention, the first conductivity type may be an n-type and the second conductivity type may be a p-type.

Further, an insulating film is formed on the surface of a semiconductor substrate, openings are formed on the insulating film, and conductors serving as electrodes are formed in the openings.

For instance, carriers (electrons in this case) generated in the light-receiving region 102 move transversely as shown in FIG. 1C and the electrons are collected to the groove of potential, i.e., the region 4 whose potential is the lowest.

In the case where such a potential structure is not present, the generated electrons stray in the substrate due to their diffusion. When the electrons cannot reach the region 4 during their life time, they will be recombined with positive holes and dissipate.

As shown in FIG. 1D, another feature of the present invention resides in that the impurity concentration and the junction depth of the third semiconductor region 3 on the surface, the first semiconductor region 1 and the second semiconductor region 2 and the potential applied to the electrode region 4 and the region 1 are set so that the second semiconductor region 2 is depleted throughout a substantially entire area thereof. As a result, the second semiconductor region 2 hardly contributes to capacitance, so that the capacitance of the light-receiving portion can be reduced.

More specifically, the electrons generated in the vicinity of the junction interface of the region 2 and the region 1 are collected to the region 2 in accordance with a built-in potential due to the pn junction therebetween. On the other hand, the electrons generated in the vicinity of the junction interface of the region 2 and the region 3 are collected to the region 2 in accordance with a built-in potential due to the pn junction therebetween. Thus, the region 2 of the light-receiving region 102 is almost depleted due to the above described two pn junctions, a neutral region does not exist. This state is referred to as "full-depletion formation". Then, the collected electrons are gathered to the region 4 as described above.

Figure 2:
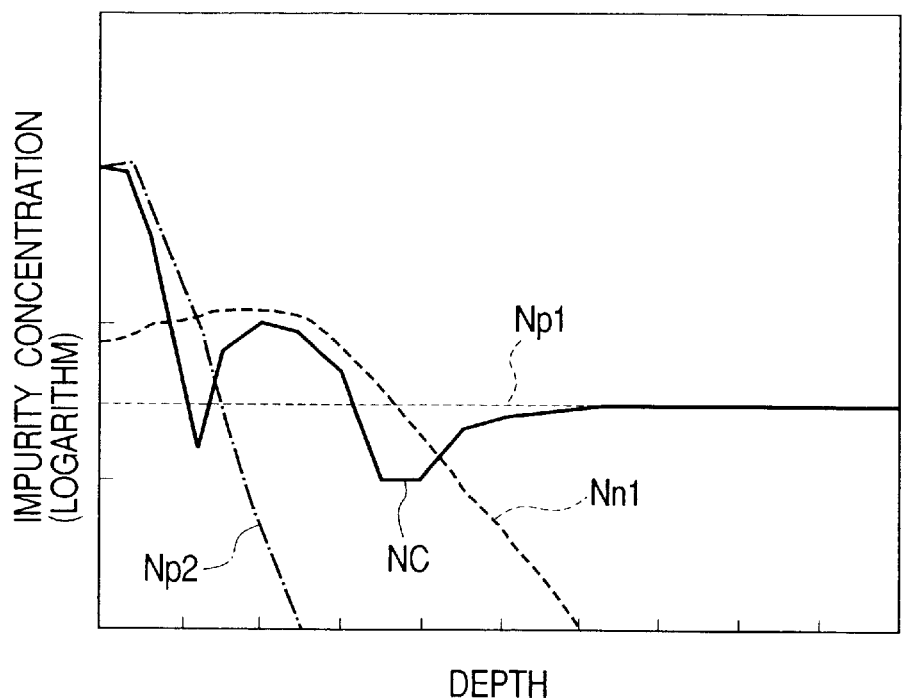
FIG. 2 is a graph showing an impurity concentration distribution in the light-receiving element according to the embodiment of the present invention.

FIG. 2 shows the distribution of the concentration of impurities in the direction along the line 1D—1D of FIG. 1B.

Np1 denotes the concentration of p-type impurities such as boron in the p-type semiconductor substrate which is a starting material of the region 1. Nn1 denotes the concentration of n-type impurities such as phosphorus or arsenic introduced to form the region 2. Np2 denotes the concentration of p-type impurities introduced to form the region 3. Further, NC denotes the net concentration (net value) of impurities in each region.

The impurity concentration and the thickness of each region can be selected from the following ranges. The parameter of the thickness indicates a junction depth from the surface of the substrate.

The impurity concentration ND1 of the first semiconductor region 1 is in a range of $10^{14}$ cm$^{-3}$ to $10^{17}$ cm$^{-3}$, and more preferably in a range of $10^{15}$ cm$^{-3}$ to $10^{16}$ cm$^{-3}$.

The impurity concentration ND2 of the second semiconductor region 2 is in a range of $10^{15}$ cm$^{-3}$ to $10^{18}$ cm$^{-3}$, and more preferably in a range of $10^{16}$ cm$^{-3}$ to $10^{17}$ cm$^{-3}$, and the junction depth is in a range of 0.2 $\mu$m to 2 $\mu$m.

The impurity concentration ND3 of the semiconductor region 3 is in a range of $10^{16}$ cm.$^{-3}$ to $10^{19}$ cm$^{-3}$, and more preferably in a range of $10^{17}$ cm$^{-3}$ to $10^{18}$ cm$^{-3}$, and the junction depth is in a range of 0.1 $\mu$m to 0.5 $\mu$m.

The impurity concentration ND4 of the electrode region 4 is in a range of $10^{18}$ cm$^{-3}$ to $10^{21}$ cm$^{-3}$, and more preferably, in a range of $10^{19}$ cm$^{-3}$ to $10^{20}$ cm$^{-3}$ and the junction depth ranges from 0.1 $\mu$m to 0.3 $\mu$m.

It is desirable to make the impurity concentration ND2 of the second semiconductor region 2 higher than the impurity concentration ND1 of the first semiconductor region 1 and to make the impurity concentration ND3 of the third semiconductor region 3 higher than the impurity concentration ND2 of the second semiconductor region 2.

Figure 3:
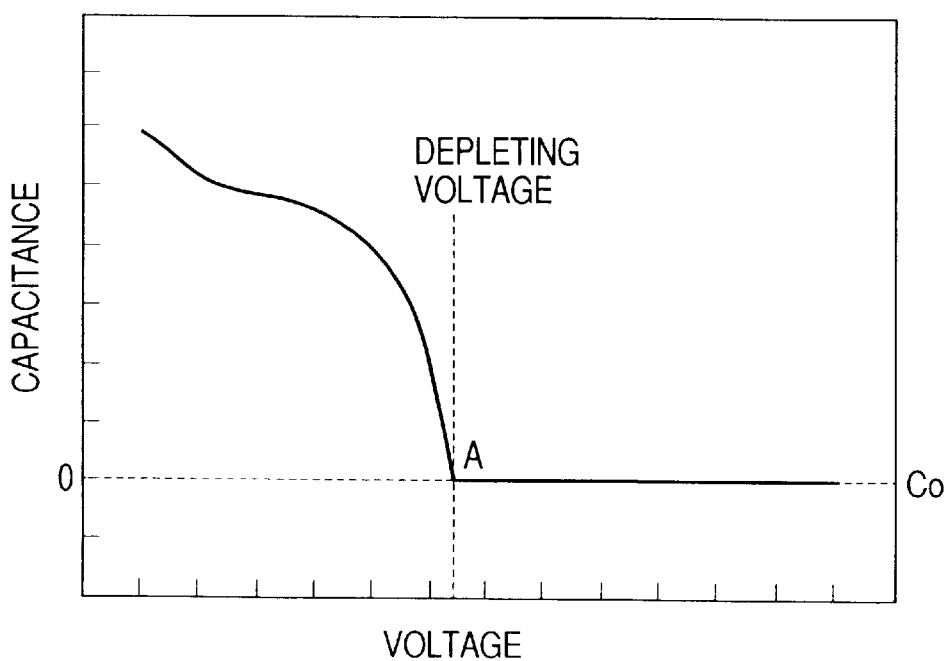
FIG. 3 is a graph showing the relationship between an applied voltage and the capacitance of the light-receiving element according to the embodiment of the present invention.

For a more detailed explanation, the relationship between the voltage of the electrode region 4 and a capacitance at that time is shown in FIG. 3. As the voltage rises, the capacitance decreases. In FIG. 3, the capacitance of the electrode region 4 becomes constant from a point A as a boundary.

When the voltage is low, the region 2 is not depleted and the capacitance changes depending on the capacitance component of a depletion layer between the region 2 and the region 3 and the capacitance component of a depletion layer between the region 2 and the region 1. In other words, as the capacitance of the region 4 rises, the depletion layer is more spread, so that the capacitance is gradually decreased. However, when the two upper and lower depletion layers are connected together, the region 2 in the light-receiving region 102 is almost fully depleted, hence, the capacitance is abruptly decreased, and then, becomes constant. The transition point thereof is indicated by the point A of FIG. 3. The voltage in this point A is referred to as "depleting voltage".

Since the depleting voltage is determined depending on the thickness and the impurity concentration of each region 1, 2 or 3, (a) the potential of the electrode region 4 under a state in which the light-receiving element is reset and (b) the potential of the electrode region 4 under a state in which the optical output of the light-receiving element is saturated are set to this depletion voltage or higher, hence the capacitance of a photodiode itself can be substantially reduced to the junction capacitance (Co) or so on the bottom portion of the region 101 to realize a high sensitivity.

When the electric charge generated by light is accumulated in the electrode region, the potential of the electrode changes. However, an operating point (a range in which the potential changes) is designed so as to have the depletion voltage or higher, so that a photoelectric conversion characteristic with high sensitivity and good linearity can be obtained, because the capacitance of the electrode region 4 has a linearity.

Further, when the voltage is lowered from the depleting voltage in the boundary, a capacitance value is increased from Co to the capacitance value determined by the area of the region 2 on the basis of exponential function.

Specifically stated, the capacitance value of a photodiode in which the electrode region 4 is not depleted is about 4400 times as large as the capacitance value of a photodiode in the case of the light-receiving element provided with the first region 1 having a thickness of approximately 600 $\mu$m and an impurity concentration of 1×$10^{16}$ cm$^{-3}$, the region 2 having a junction depth of 0.5 $\mu$m and an impurity concentration of 1×$10^{17}$ cm$^{-3}$, the region 3 having a junction depth of 0.2 $\mu$m and an impurity concentration of 1×$10^{18}$ cm$^{-3}$ and the region 4 having a junction depth of 0.2 $\mu$m and an impurity concentration of 1×$10^{19}$ cm$^{-3}$, the region 2 having an upper surface with an area of 80 $\mu$m×80 $\mu$m and the region 4 having an upper surface with an area of 1.2 $\mu$m×1.2 $\mu$m.

If such a potential profile as shown in FIG. 1C is not present, electrons generated in the vicinity of the electrode region 4 are apt to reach there. However, electrons generated in the end of a light-receiving surface reach the electrode region apart therefrom by about 40 µm with an extremely low probability, so that a sensitivity is seriously deteriorated.

On the contrary, according to the structure of the present embodiment, most of electrons generated within a distance of at least about 1 µm from the surface can be collected in any position of the light-receiving surface. Particularly, since most of blue light is absorbed within a range of 1 µm from the surface of silicon, the sensitivity to the blue light which is a problem of a visible light sensor is improved.

Further, a high energy ion implantation technique or the like is utilized to use such a retrograde well structure which has the peak value of the impurity concentration in the substrate, or, conversely, the concentration of the substrate 1 is lowered to widen the depletion layer so that the electrons generated in a deeper portion can be collected.

Still further, an impurity layer with a high concentration is formed on the surface of the substrate, an epitaxial layer with a low impurity concentration is provided thereon, and the present invention is applied thereto, so that the structure of a light-receiving portion with a high sensitivity to a long wavelength can be obtained.

Figure 4:
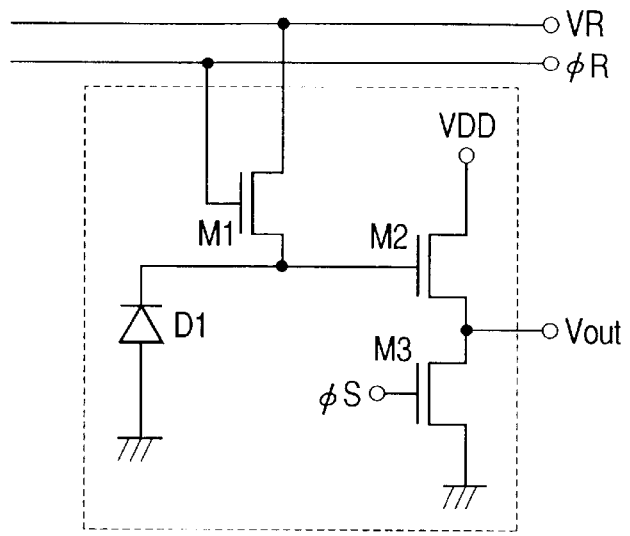
FIG. 4 is a circuit diagram of a read circuit and a reset circuit employed in the present invention.

FIG. 4 shows one example of a read and reset circuit employed in the present invention. D1 denotes a photodiode composed of a light-receiving element according to the present invention. M1 denotes a reset switch composed of an MOS transistor or the like. M2 denotes an amplifier element composed of an MOS transistor or the like. M3 indicates a load composed of an MOS transistor or the like and can be used as a selecting switch. VR denotes a reset line or a reset terminal for supplying a resetting reference voltage. VDD indicates a source voltage line or a source voltage terminal for supplying a source voltage. φR indicates a reset control line for turning on/off the reset switch M1. Vout denotes an output terminal.

When the reset switch M1 is turned off after turning on the reset switch M1 and supplying the resetting reference voltage not lower than the depletion voltage to a cathode (a region 4 shown in FIG. 1A), the storage of photocarriers is started and the potential of the input terminal of the amplifier element M2 is changed. When an on-pulse is inputted to a selecting line φS after the lapse of a predetermined storage time and the selecting switch M3 is turned on, a current will be supplied through a source follower circuit having the transistors M2 and M3 and an output signal will be obtained.

Embodiment 2

Figure 5A:
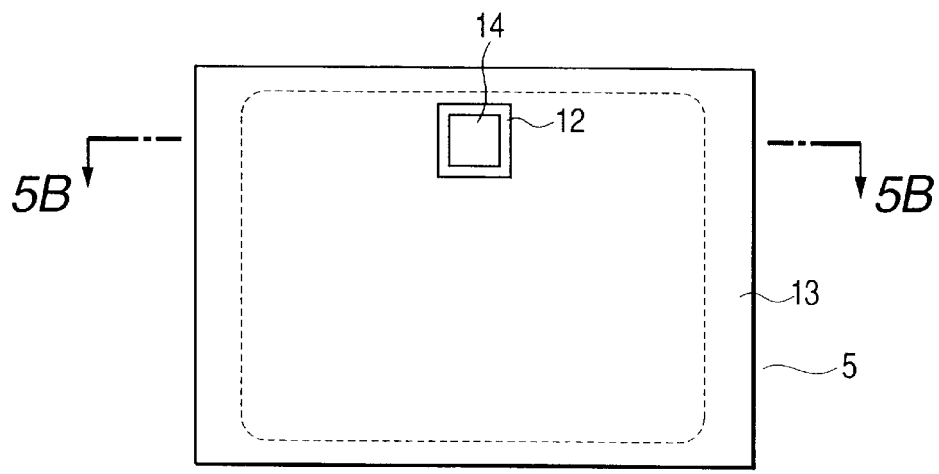
FIG. 5A is a top view of the light-receiving element according to another embodiment of the present invention.

FIG. 5A is a top view of the light-receiving element according to a second embodiment of the present invention.

Figure 5B:
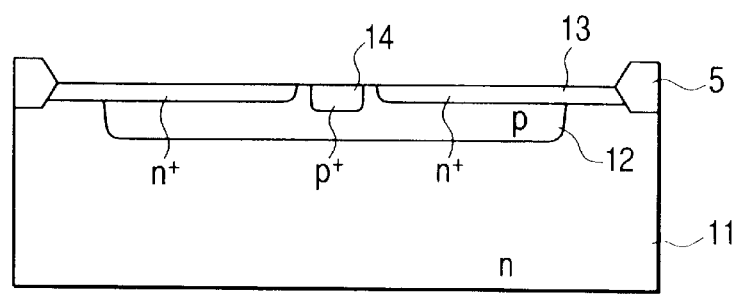
FIG. 5B is a cross-sectional view of the light-receiving element according to another embodiment of the present invention.

FIG. 5B is a sectional view taken in the line 5B—5B of FIG. 5A.

In the drawings, reference numeral 11 denotes a first semiconductor region of a first conductivity type (here, n-type); 12: a second semiconductor region of a second conductivity type (here, p-type); 13: a third semiconductor region of the first conductivity type; and 14: an electrode region of the second conductivity type and having a high impurity concentration.

According to the second embodiment, in order to isolate the light-receiving element, an element isolation region 5 is formed by a selective oxidizing method called a LOCOS or the like.

Now, a method of producing the light-receiving element according to the second embodiment of the present invention will be described below.

Figure 6A:
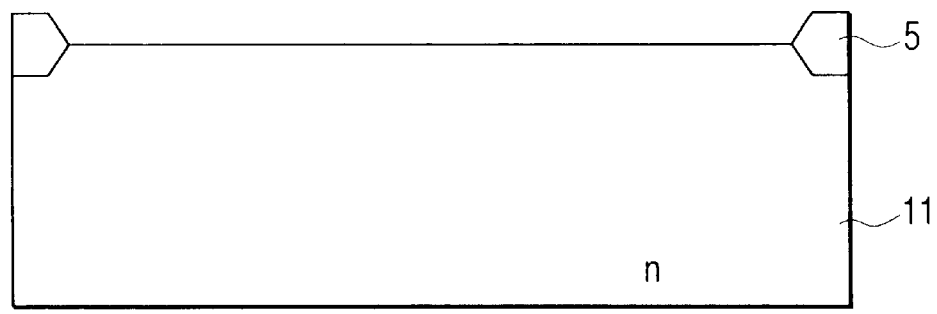
FIGS. 6A, 6B and 6C are schematically cross-sectional views for showing a method of producing the light-receiving element according to the embodiment of the present invention.
Figure 6B:
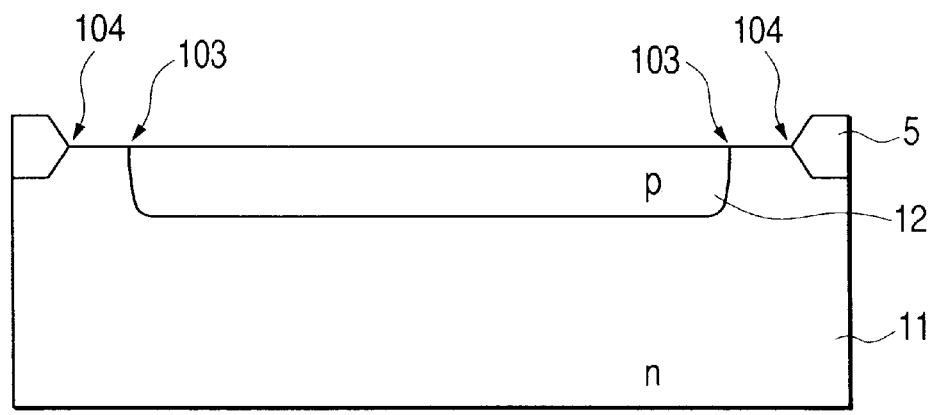

Initially, the element isolation region 5 composed of silicon oxide is formed in accordance with the selective oxidizing method in which a silicon nitride film not shown in the drawings is formed as an oxidation-resistant mask and then a thick oxide film is formed on a portion exposed therefrom (see FIG. 6A). This method is well-known as LOCOS. Then, a photoresist mask not shown in the drawings is formed, ion-implantation is carried out and a thermal treatment is carried out to form the second semiconductor region 12 of the p-type in the first semiconductor region 11 composed of the n-type semiconductor substrate. The edge 103 of the second semiconductor region 12 is separated from the edge 104 of the element isolation region 5 where many defects exist, thereby preventing a depletion layer formed due to a pn junction from reaching the edge 104. Thus, the generation of a dark current due to the defects can be suppressed (see FIG. 6B).

Figure 6C:
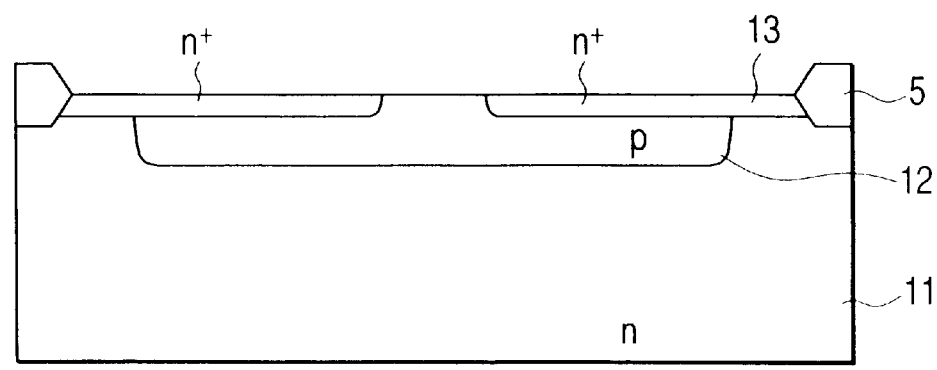

The photoresist mask not shown in the drawings is formed, the ion-implantation is carried out thereto, the photoresist mask is removed, and the thermal treatment is performed to form the n-type third semiconductor region 13 on the surface of the substrate (see FIG. 6C).

Then, the photoresist mask not shown in the drawings is formed, the ion-implantation is applied thereto, and the thermal treatment is performed after the removal of the photoresist mask to form the p-type electrode region 14. Thus, a structure shown in FIG. 5B is obtained.

Thereafter, as occasion demands, an insulating film is formed to cover the surface of the substrate and contact holes are opened thereon, and a read and reset circuit formed in another position of the same semiconductor substrate may be connected to the electrode region 14 through a wiring.

Since in the second embodiment of the present invention signals are outputted from the anode of a photodiode, the potential relationship concerning the order of a high potential, a low potential and the conductivity types and the structure of the read and reset circuit employed therein are reverse to those of the first embodiment.

Figure 7:
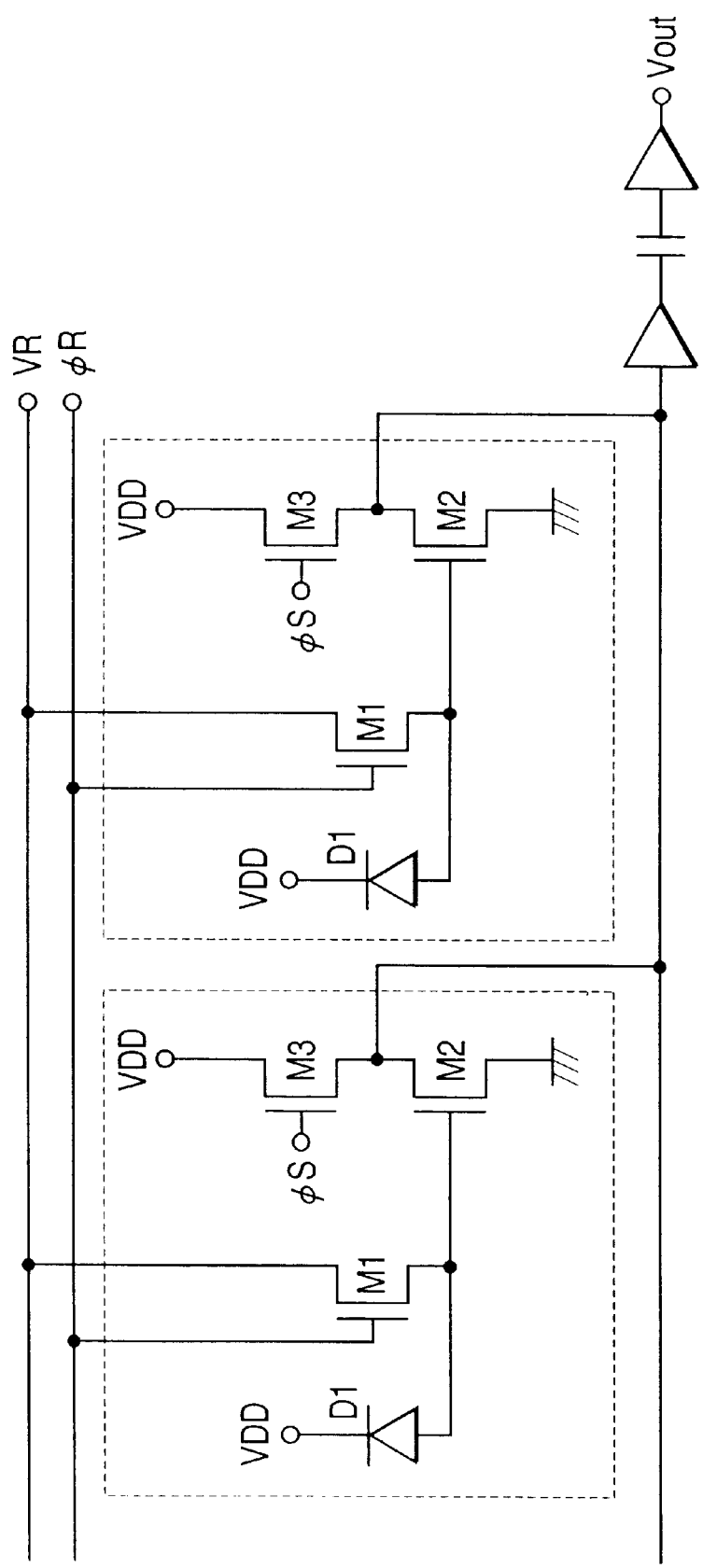
FIG. 7 is a circuit diagram of a read circuit and a reset circuit employed in the present invention.

FIG. 7 shows a circuit diagram of another read and reset circuit employed in the present invention. D1 denotes a photodiode composed of the light-receiving element of the present invention. M2 and M3 constituted a source follower serving as an amplifier which conducts charge/voltage conversion to photocharges generated in the photodiode D1. In this case, pixels are selected by turning on/off a switch M3 also serving as the low current source of the source follower. After the photocharge information of the pixels is read by the switch M3, the photodiode D1 is reset by a reset switch M1. A reset voltage is set so that a reverse voltage not lower than a depleting voltage is applied to the anode of the photodiode. For instance, since the depleting voltage is 1.0 volt as the reverse bias voltage of the photodiode, and the reset voltage is set so that the reverse bias voltage of 3 volt is applied. Specifically stated, when the source voltage of 5 volt applied to a terminal VDD is used, the reset voltage applied to a terminal VR is set to 2.0 volt to carry out a reading operation.

In the second embodiment, when the size of a light-receiving surface is set to 40 µm×40 µm and the size of the upper surface of the electrode region 14 is set to 6 µm×6 µm, the capacitance of the photodiode is 3.8 fF which is lower than that of the prior art, whereby a photodiode with a higher sensitivity can be obtained. Further, in the present embodiment, video information in the front region of the light-receiving surface can be obtained, so that high definition images can be obtained.

Specially, the present embodiment is effectively applied to a light-receiving element provided with a large light-receiving surface in which the collection efficiency of light becomes lower. When the size of the light-receiving surface is 20 μm square or larger, the collection efficiency begins to be lower. Therefore, the present embodiment can be effectively applied particularly to a light-receiving element having a light-receiving surface larger than the above size.

Embodiment 3

Figure 8A:
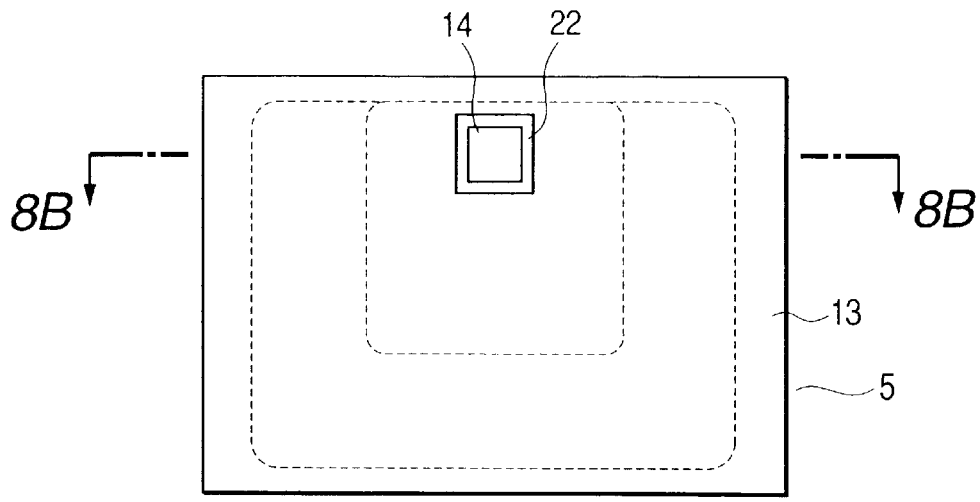
FIG. 8A is a top view of a light-receiving element according to further another embodiment of the present invention.
Figure 8B:
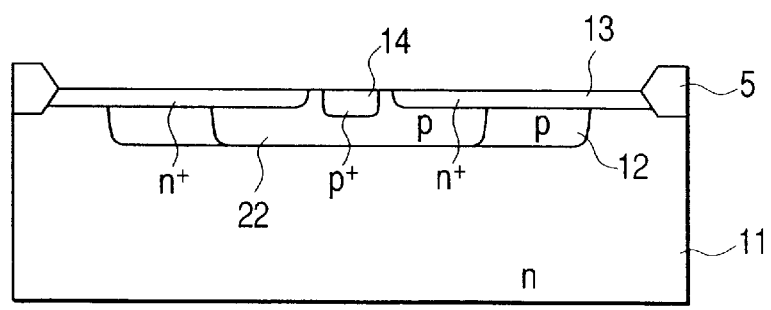
FIG. 8B is a cross-sectional view of the light-receiving element according to further another embodiment of the present invention.
Figure 9:
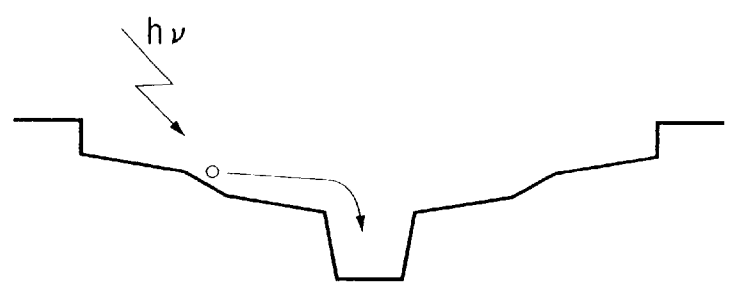
FIG. 9 is a schematic diagram of a potential profile in the horizontal direction of the light-receiving element according to the embodiment of the present invention.

FIG. 8A shows a top view of a light-receiving element according to the third embodiment of the present invention and FIG. 8B shows a cross-sectional view taken in the line 8B—8B of FIG. 8A. The present embodiment is different from the embodiment shown in FIGS. 5A and 5B in a point that the light-receiving element according to the third embodiment includes a second semiconductor region composed of two regions having different impurity concentrations from each other. The inner region 22 in contact with an electrode region 14 has an impurity concentration higher than that of the outer region 12 and lower than that of the electrode region 14. The junction depth of the inner region 22 may be smaller or larger than that of the outer region 12. FIG. 9 shows a potential profile in the direction along the line 8B—8B of FIG. 8A. Thus, since the inner region 22 and the outer region 12 have different impurity concentrations from each other, a potential slope steeper than that shown in FIG. 1C is formed. Accordingly, electric charges generated in the end portion of a light-receiving surface can be easily collected to the electrode region 14 and a time necessary for reading photosignals can be reduced.

Now, a method of producing the light-receiving element according to the third embodiment of the present invention will be described hereinafter.

Figure 10A:
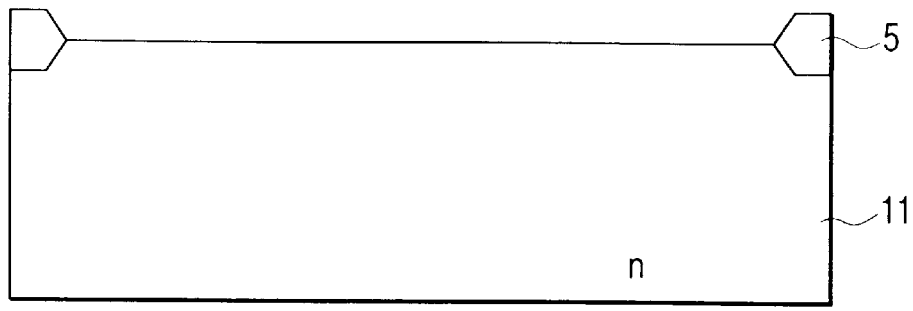
FIGS. 10A, 10B and 10C are schematically cross-sectional views for showing one example of a method of producing the light-receiving element according to the embodiment of the present invention.

An element isolation region 5 composed of silicon oxide is formed in accordance with a selective oxidizing method in which a silicon nitride film not shown in the drawings is formed as an oxidation-resistant mask and a thick oxide film is formed in a portion exposed therefrom (see FIG. 10A).

Figure 10B:
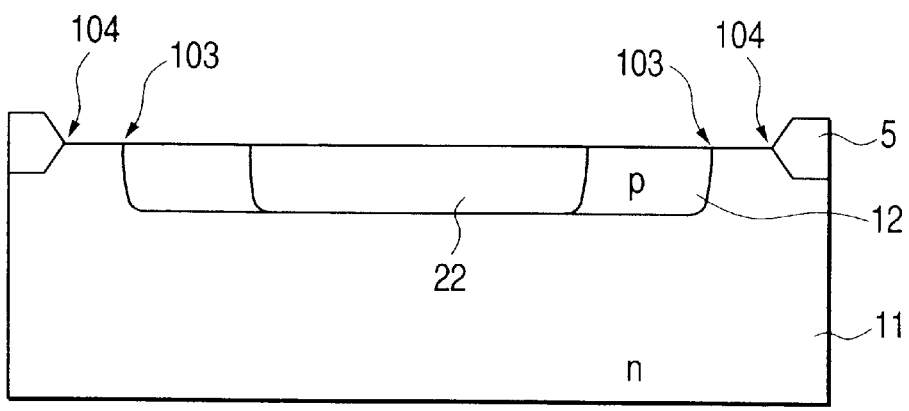

Then, a photoresist mask not shown in the drawings is formed, ion-implantation is applied thereto and a thermal treatment is carried out to form a p-type second semiconductor region 12 in a first semiconductor region 11 composed of an n-type semiconductor substrate. The edge 103 of the second semiconductor region 12 is made apart from the edge 104 of the element isolation region 5 where many defects are found, so that a depletion layer formed by a pn junction is prevented from reaching the edge 104. In such a manner, the generation of a dark current due to the defects can be suppressed. Thus, the photoresist mask (not shown in the drawings) is formed and the inner region 22 with a high impurity concentration is formed by the ion-implantation and the thermal treatment (FIG. 10B).

Figure 10C:
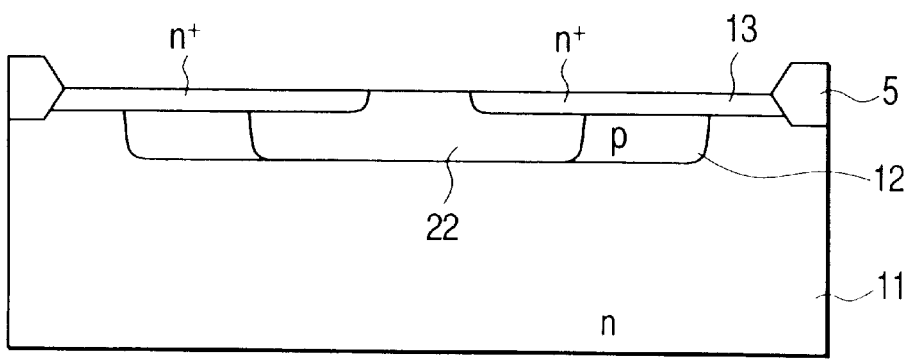

An n-type third semiconductor region 13 is formed in accordance with the ion-implantation and the thermal treatment (see FIG. 10C).

Then, the p-type electrode region 14 is formed by the ion-implantation and the thermal treatment to obtain a structure shown in FIG. 8B.

Thereafter, as occasion demands, an insulating film is formed to cover surface of a substrate, and openings are formed on the insulating film, and a read and reset circuit formed in another position of the same semiconductor substrate may be connected to the electrode region 14 through a wiring.

As the read and reset circuit, the same circuit as shown in FIG. 7 can be employed as described above.

Embodiment 4

Figure 11A:
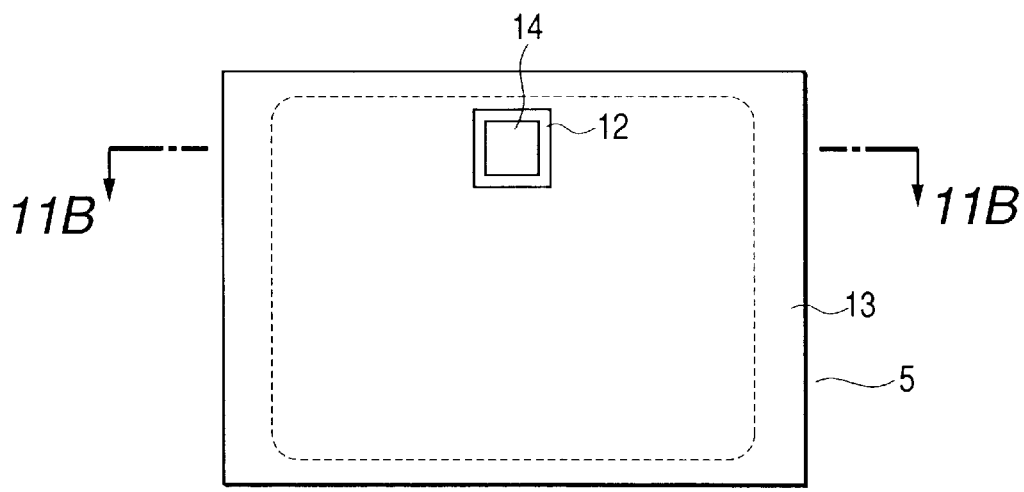
FIG. 11A is a top view of the light-receiving element according to further another embodiment of the present invention.
Figure 11B:
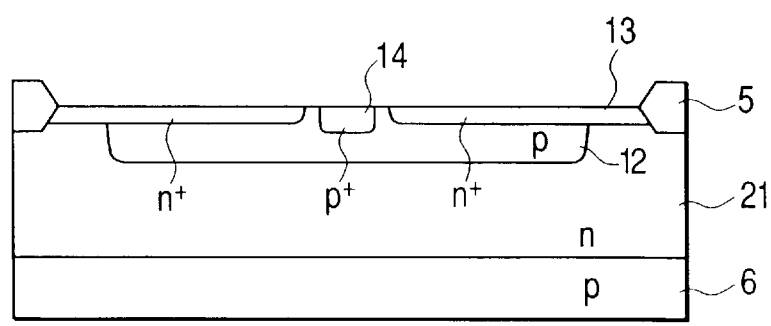
FIG. 11B is a cross-sectional view of the light-receiving element according to another embodiment of the present invention.

FIG. 11A shows the upper surface of a light-receiving element according to a fourth embodiment of the present invention. FIG. 11B shows a cross-sectional view taken in the line 11B—11B of FIG. 11A.

The fourth embodiment is different from the second embodiment shown in FIGS. 5A and 5B with respect of a point that an n-type epitaxial layer 21 formed on the surface of a p-type semiconductor substrate by epitaxial growth is employed as a first semiconductor region in the fourth embodiment.

According to the fourth embodiment, an n-type well formed by ion-implantation and thermal treatment in the p-type semiconductor substrate can be used in place of forming the epitaxial layer 21. Further, in the light-receiving element according to the fourth embodiment, electric charges generated in the deep position of the p-type semiconductor substrate can be prevented from arriving at a p-type second semiconductor region 12. More specifically, when the thickness of the well is, for example, about 4 μm, most of holes generated in the position of depth apart by about 4 μm from the surface of the light-receiving element will flow to the p-type semiconductor substrate. Therefore, the generation of a dark current can be suppressed.

In the case of the structure as shown in FIGS. 5A and 5B, noise generated when the reset circuit or the read circuit is driven readily enters the second semiconductor region. On the other hand, as in the present embodiment, the second semiconductor region is formed in the well provided for each pixel or provided common to all pixels, hence the entry of the noise can be suppressed.

Embodiment 5

Figure 12:
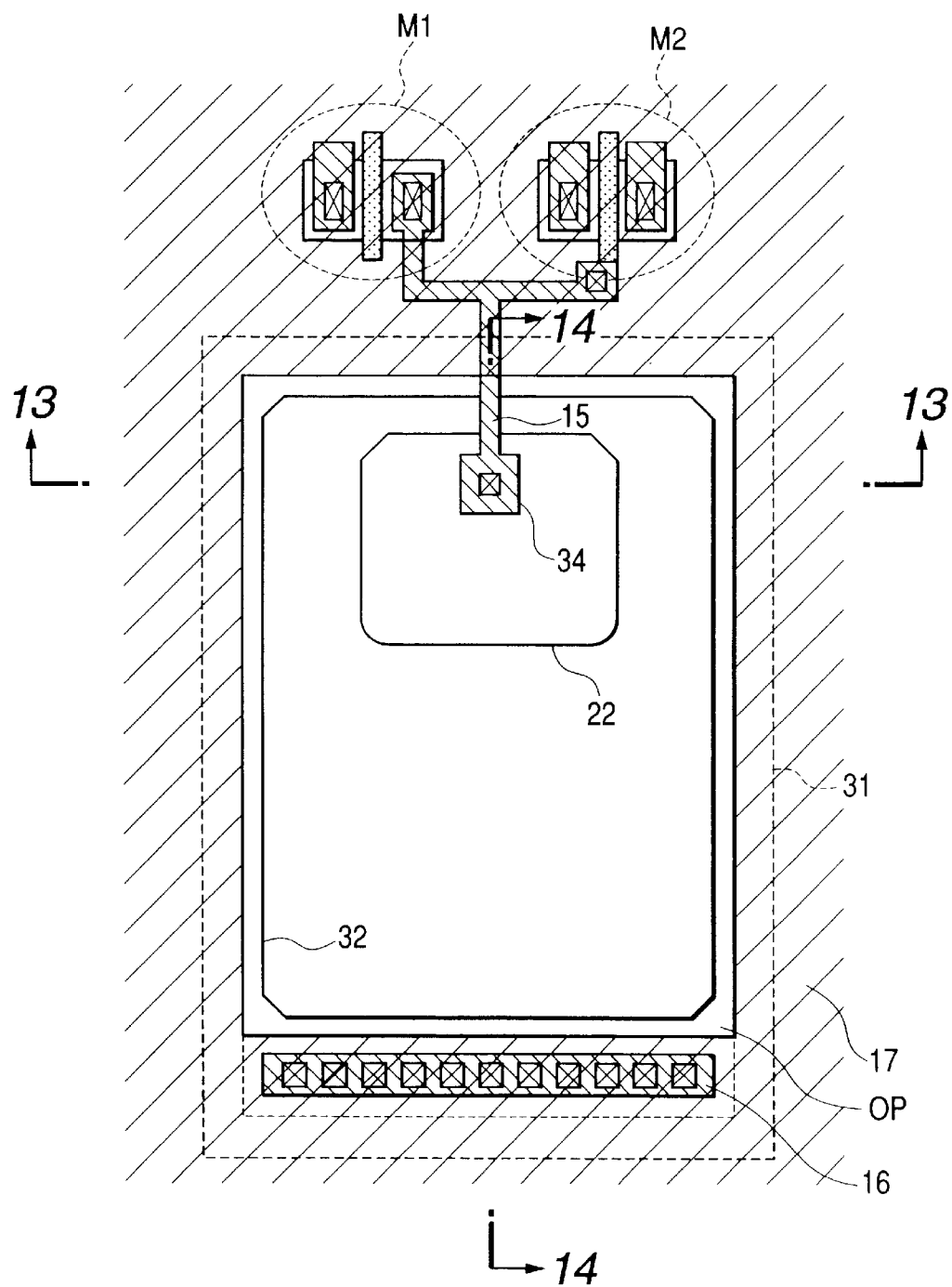
FIG. 12 is a top view of the light-receiving element according to further another embodiment of the present invention.

FIG. 12 shows a top view of a light-receiving element according to a fifth embodiment of the present invention.

Figure 13:
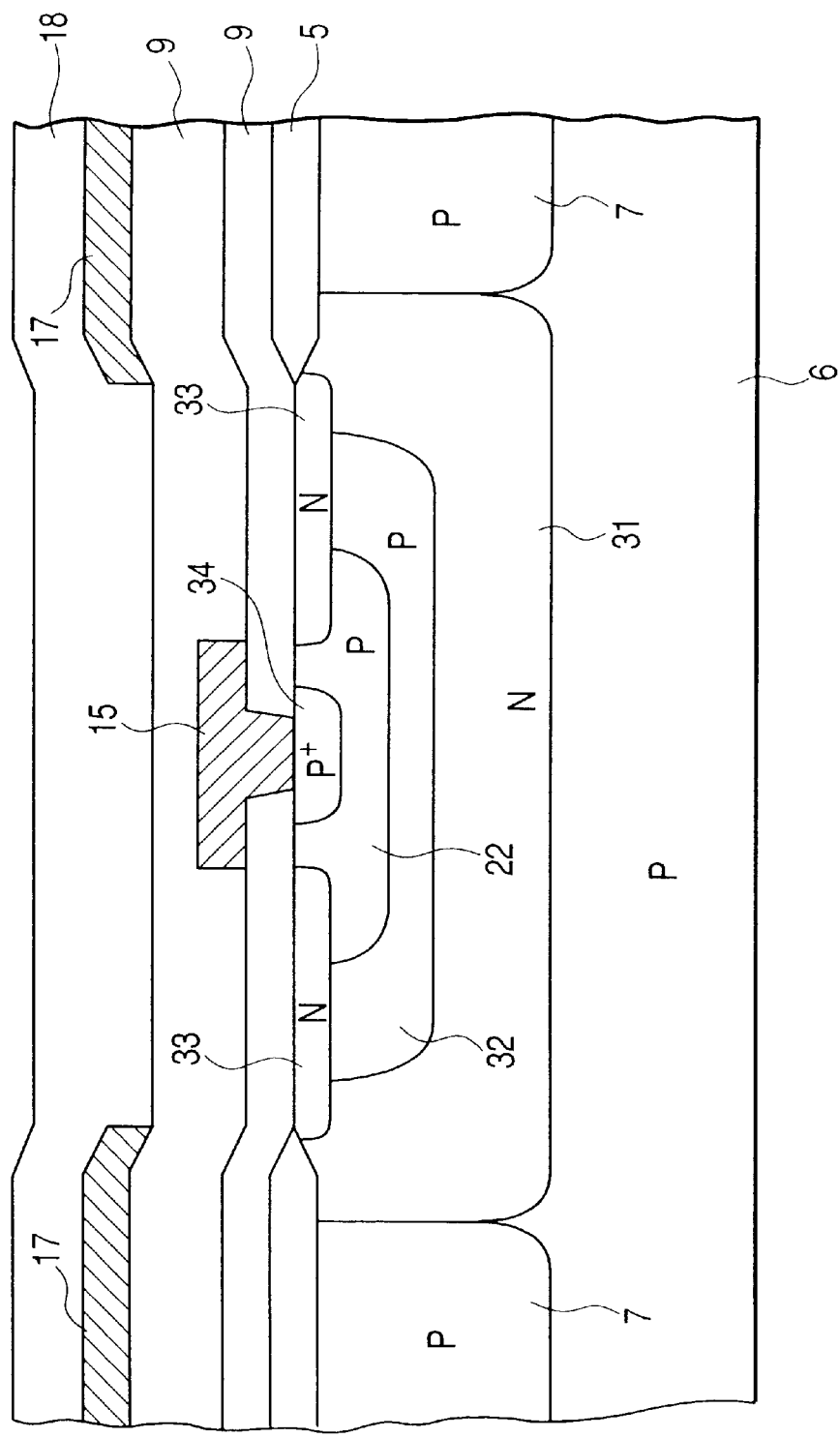
FIG. 13 is a cross-sectional view of the light-receiving element according to further another embodiment of the present invention.

FIG. 13 shows a cross-sectional view taken in the line 13—13 of FIG. 12.

Figure 14:
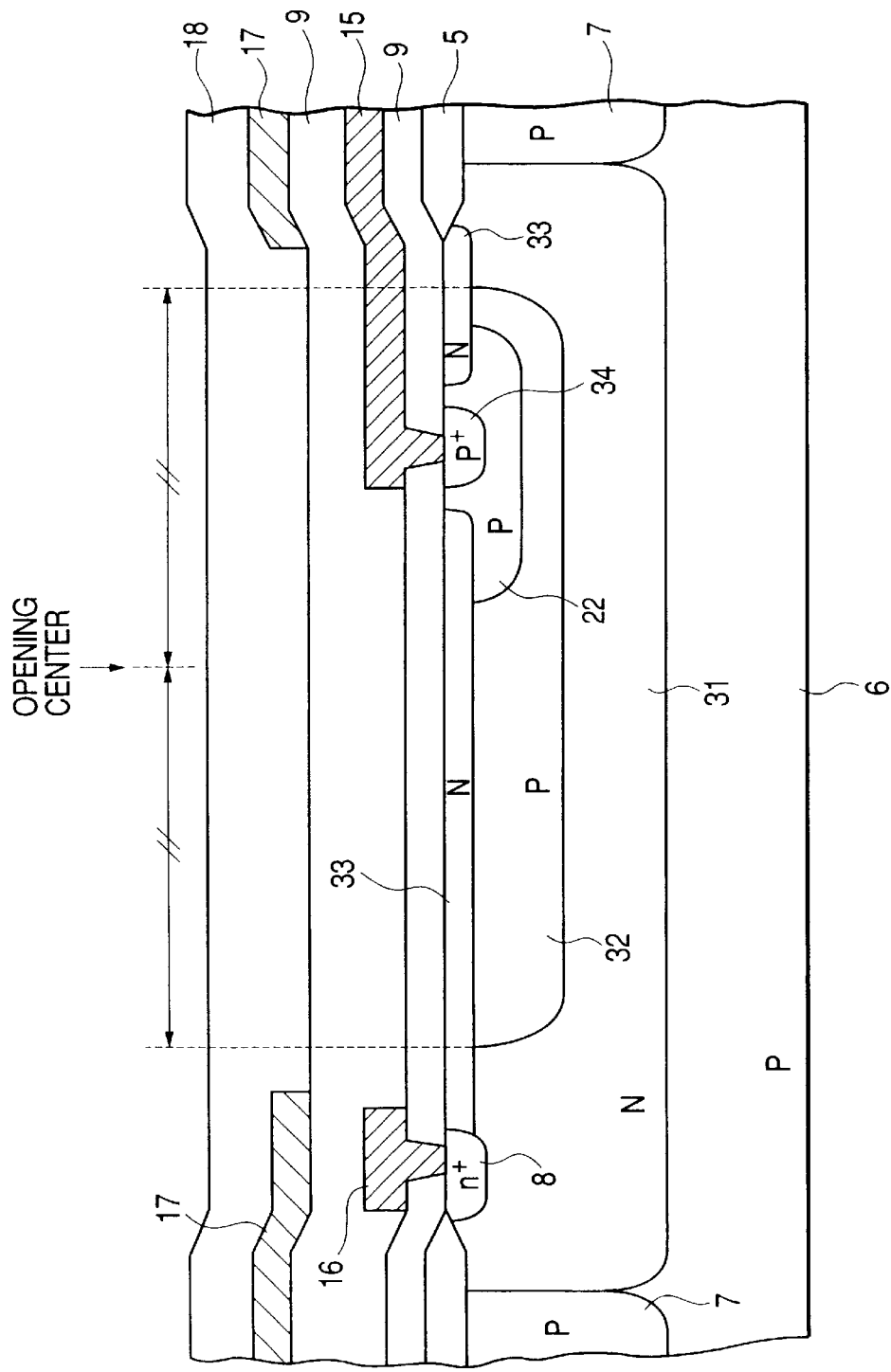
FIG. 14 is a cross-sectional view of the light-receiving element according to further another embodiment of the present invention.

FIG. 14 shows a cross-sectional view taken in the line 14—14 of FIG. 12.

In FIG. 12, a p-type second semiconductor region 32 for forming a photodiode serving as a light-receiving element is formed in an opening portion OP. Further, in this region 32, a p-type inner region 22 is formed. In the inner region 22, a $p^+$-type electrode region 34 is formed. The electrode region 34 is electrically connected to the drain part of an MOS transistor M1 as a resetting switch and to the gate part of a source follower MOS transistor M2 as an amplifier element through a wiring 15 made of a first metal layer. Further, the opening portion OP of the light-receiving element is defined by a light-shielding layer 17 formed with a second metal layer. The light-shielding layer 17 is connected to a power source and fixed to a predetermined reference potential.

Here, the $p^+$-type electrode region 34 is arranged nearer a portion where the drain part of the resetting MOS transistor M1 and the source follower MOS transistor M2 are arranged than the center of the opening portion. In the side opposite to the electrode region 34, is provided a power source line 16 for determining the potential of an n-type well region 31 serving as a first semiconductor region. In FIG. 12, the size of the opening portion OP is set to 40 μm×60 un.

As apparent from FIGS. 13 and 14, the second semiconductor region 32 is formed in the opening portion OP of the n-type well region 31 provided in a p-type semiconductor substrate 6, further, the inner region 22 is formed in the second semiconductor region 32, and the electrode region 34 is provided in the form of an island in the inner region 22.

Further, on the major surfaces of the second semiconductor region 32 and the inner region 22, an n-type surface region 33 serving as a third semiconductor region is provided and is electrically connected to the n-type well region 31 at the end of the opening portion OP.

Accordingly, the photodiode is formed by the pn junctions of the second semiconductor region 32 composed of the p-type semiconductor, the inner region 22 and the first and third semiconductor regions 31 and 33 composed of the N-type semiconductors. Photocarriers photoelectrically converted by the photodiode are collected to the electrode region 34 composed of the p+-type semiconductor to change the potential of the wiring 15 formed with the first metal layer.

Further, a protective film 18 is provided on the light-shielding layer 17 made of the second metal layer.

Here, the p+-type region 34 is arranged nearer the side where the resetting MOS transistor M1 and the source follower MOS transistor M2 are arranged than the center of the opening portion, that is, in the right side of FIG. 14. On the other hand, the contact of the power source line 16 for supplying a voltage to the n-type well region 31 is arranged only in a side opposite to the p+-type region 34.

Further, the n-type well region 31 is formed in the p-type substrate 6 and the periphery of each pixel is surrounded by a p-type well region 7 serving as an element isolation region and each pixel is electrically separated from another pixel by a pn junction.

With reference to FIGS. 13 and 14, the approximate representative values of the surface concentration and the junction depth of each region will be shown below.

The p-type substrate 6: about $1 \times 10^{15}$ (cm$^{-3}$);
  the first semiconductor region 31: about $1 \times 10^{17}$ (cm$^{-3}$) and about 4.0 μm;
  the second semiconductor region 32: about $2 \times 10^{17}$ (cm$^{-3}$) and about 0.35 μm;
  the inner region 22: about $3 \times 10^{17}$ (cm$^{-3}$) and about 0.30 μm;
  the third semiconductor region 33: about $3 \times 10^{18}$ (cm$^{-3}$) and about 0.20 μm; and
  the electrode region 34: about $3 \times 10^{19}$ (cm$^{-3}$).

In addition, the depleting voltage of each of the second semiconductor region 32 and the inner region 22 in the fifth embodiment is shown below.

The second semiconductor region 32: about −1.0 V; and the inner region 22: about −1.5 V.

Accordingly, since the depleting voltage of the second semiconductor region 32 and the inner region 22 becomes higher toward the electrode region 34, the potential slope of the photocarriers is formed, so that the photocarriers can be more efficiently collected to the electrode region 34 part.

Further, according to the fifth embodiment of the present invention, the photo-mask (reticle) for exposure is formed so that each corner portion of the second semiconductor region 32 and the inner region 22 has an obtuse angle, so that the groove of the potential due to the unevenness of electric field in the corner portions is hardly formed. Thus, a residual image characteristic is improved. Still further, since the region 31 is formed in the p-type semiconductor substrate 6 and has a structure that the periphery for each pixel is surrounded by the p-type well region 7, a crosstalk generated due to the entry of the photocarriers to adjacent pixels can be substantially completely controlled. Thus, a high quality resolution pattern can be obtained.

Still further, even when the photocarriers not less than a saturation are stored in a certain pixel, the overflowing photocarriers are absorbed by the surrounding p-type well region 7 or the substrate 6. Therefore, a high quality image with less bleeding can be formed without giving any influence to other pixels.

According to the present embodiment of the invention, although the second semiconductor region 32 and the inner region 22 are shown in the drawings as the regions for forming the photodiode, for instance, a second p-type inner region which includes the electrode region 34 inside the inner region 22 may be provided, and the impurity concentration and the junction depth of this second inner region may be set so as to have the depleting voltage of the second inner region higher than that of the inner region 22, so that a light-receiving element having a lower residual image characteristic can be formed.

Embodiment 6

Figure 15:
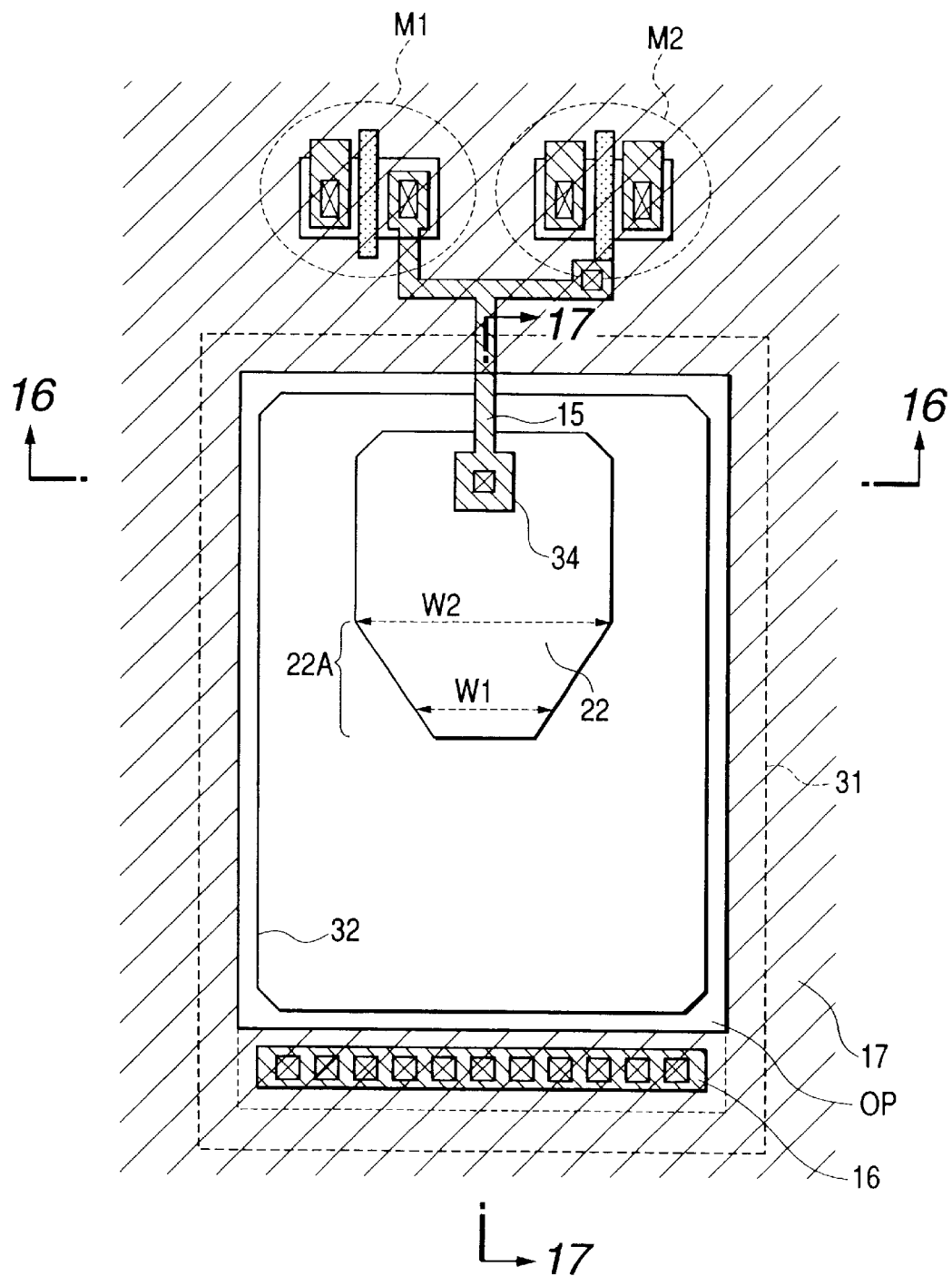
FIG. 15 is a top view of the light-receiving element according to further another embodiment of the present invention.
Figure 16:
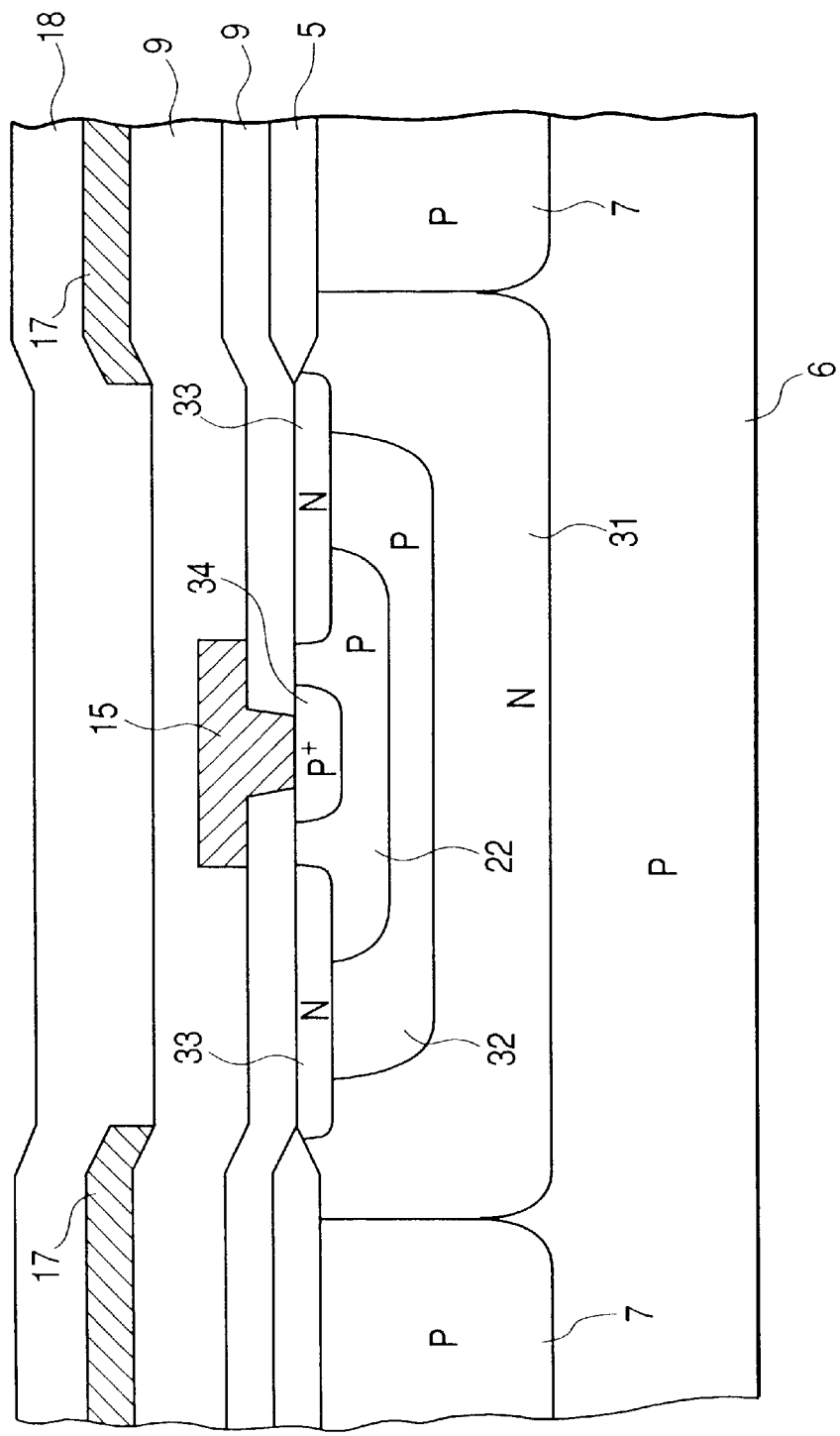
FIG. 16 is a cross-sectional view of the light-receiving element according to further another embodiment of the present invention.
Figure 17:
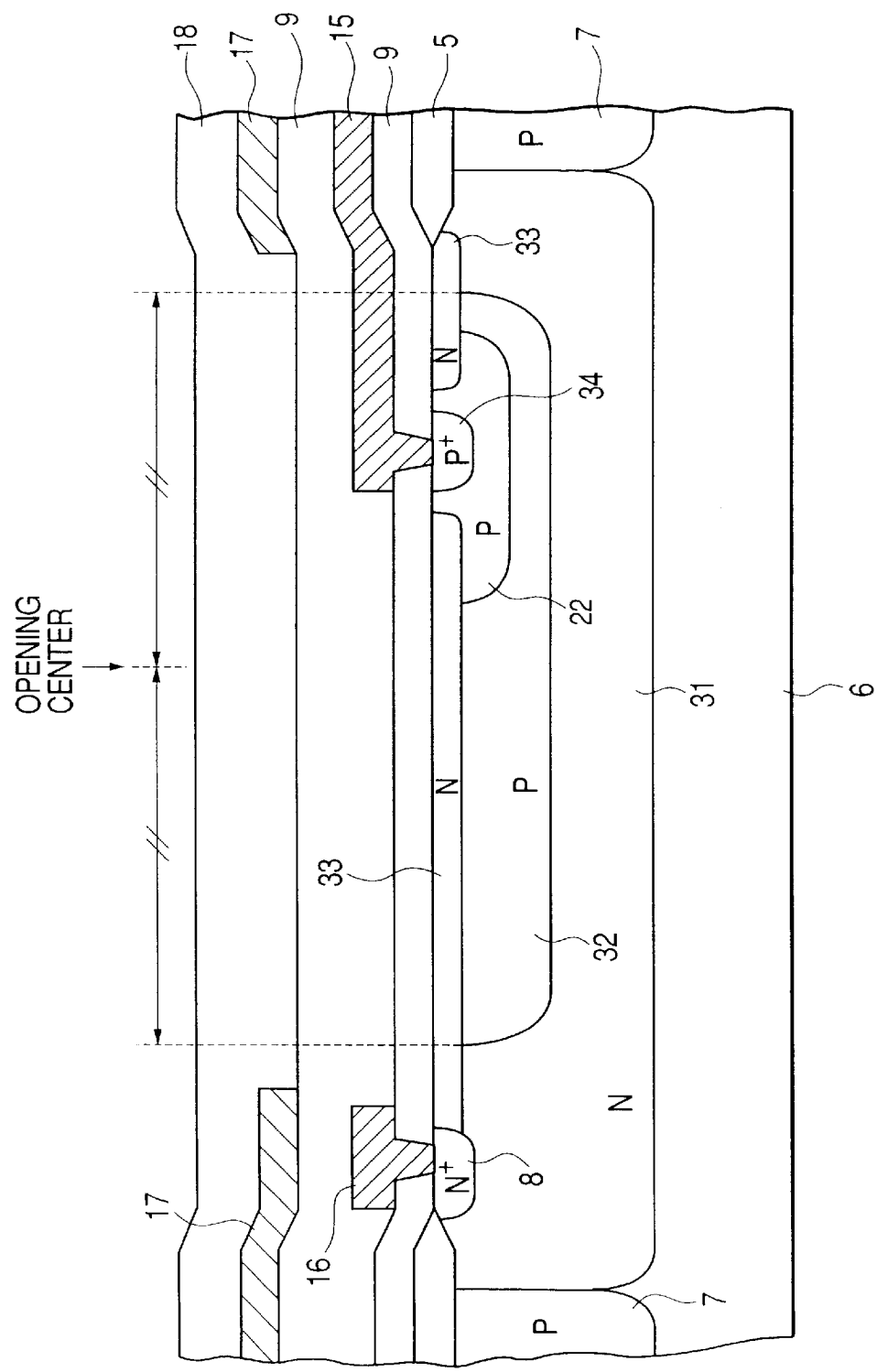
FIG. 17 is a cross-sectional view of the light-receiving element according to further another embodiment of the present invention.

FIG. 15 shows a top view of a light-receiving element according to the sixth embodiment of the present invention. FIG. 16 shows a cross-sectional view taken in the line 16—16 of FIG. 15. FIG. 17 shows a cross-sectional view taken in the line 17—17 of FIG. 15.

The light-receiving element according to the sixth embodiment is different from that according to the fifth embodiment shown in FIGS. 12 to 14 in a point that the planar shape of the inner region 22 composed of a p-type semiconductor is changed to a shape with a portion having a gradually changed width.

The portion 22A having a gradually decreased width toward a lower part of the drawings is extended downward beyond the center of a light-receiving surface (opening portion) from the upper part of the drawings.

Reference numeral 8 denotes a contact region with a high impurity concentration and serves as a cathode contact.

Referring to FIGS. 15 to 17, the second semiconductor region 32 of a photo-diode serving as a light-receiving element is formed in an opening portion OP. An inner region 22 is formed in the second semiconductor region 32. An electrode region 34 is formed in the inner region 22. The electrode region 34 is electrically connected to the drain part of a resetting MOS transistor M1 and the gate part of a source follower MOS transistor M3 through a wiring 15 made of a first metal layer. Further, the opening portion OP of the light-receiving element is defined by a light-shielding layer 17 formed with a second metal layer, and the light-shielding layer 17 is connected to a power source and fixed to a desired potential.

Here, the electrode region 34 is arranged nearer a portion where the drain part of the resetting MOS transistor M1 and the source follower MOS transistor M2 are arranged than the center of the opening portion, and a power source line 16 for supplying a reverse bias voltage to an n-type well region 31 as a first semiconductor region is provided in the opening portion side opposite to the electrode region 34. In the drawings, the size of the opening portion OP is set to 40 μm×60 μm.

Further, an n-type surface region 33 serving as a third semiconductor region is provided on the major surfaces of the second semiconductor region 32 and the inner region 22 and is electrically connected to the n-type well region 31.

Accordingly, the photodiode is formed by the pn junction between the p-type second semiconductor region 32 and the inner region 22 and the n-type well region 31 and the n-type surface region 33, hence photocarriers photoelectrically converted by the photodiode are collected to the electrode region 34 to change the potential of the wiring 15.

Further, a protective film 18 is provided on the upper part of the light-shielding layer 17 formed with a second metal layer.

Here, the electrode region 34 is arranged nearer the side where the resetting MOS transistor M1 and the source follower MOS transistor M2 are arranged than the center of the opening portion, that is to say, in the right side of FIG. 17. On the other hand, the contact of the power source line 16 for supplying the potential to the n-type well region 31 is arranged only in a side opposite to the electrode region 34 (the left side of FIG. 17).

In this case, the n-type well region 31 is formed in a p-type semiconductor substrate 6 and has a structure in which the periphery of the region 31 is surrounded by a p-type well region 7 for each pixel and the region 31 is electrically isolated for each pixel.

Further, the inner region 22 has a shape that its width gradually increases from W1 to W2 (W2>W1) toward the electrode region 34. Still further, the corner parts of the upper surfaces of the second semiconductor region 32 and the inner region 22 are formed in such a manner that they are all composed of obtuse angles larger than 90°.

With reference to FIGS. 16 and 17, the approximate representative values of the surface concentration and junction depth of the respective regions will be described below.

The p-type substrate 6: about $1 \times 10^{15}$ (cm$^{-3}$);

the first semiconductor region 31: about $1 \times 10^{17}$ (cm$^{-3}$) and about 4.0 μm;

the second semiconductor region 32: about $2 \times 10^{17}$ (cm$^{-3}$) and about 0.35 μm;

the inner region 22: about $3 \times 10^{17}$ (cm$^{-3}$) and about 0.30 μm;

the third semiconductor region 33: about $3 \times 10^{18}$ (cm$^{-3}$) and about 0.20 μm; and the electrode region 34: about $3 \times 10^{19}$ (cm$^{-3}$).

In addition, the depleting voltages of the second semiconductor region 32 and the inner region 22 in the sixth embodiment is shown below.

The second semiconductor region 32: about −1.0 V; and the inner region 22: about −1.5 V.

Accordingly, since the depleting voltages of the second semiconductor region 32 and the inner region 22 become higher toward the electrode region 34, the potential slope of the photocarriers is formed, so that the photocarriers can be more efficiently collected to the region 54.

Further, since the power source line 16 for supplying a voltage to fix the potential of the n-type well region 31 serving as the first semiconductor region is provided in a side opposite to the electrode region 34, a photocurrent due to photo-generated electrons flows through the n-type well region 31 toward the contact region 8. Thus, a potential slope is formed from the contact region 8 toward the electrode region 34, so that photo-generated holes can be more efficiently collected to the electrode region 34 to improve a residual image characteristic.

In addition, according to the sixth embodiment of the present invention, since the inner region 22 has a portion having a width increased toward the electrode region 34, when the photo-generated holes reaching the tip end of the inner region 22 flow toward the electrode region 34 due to the potential slope, the sheet resistance of the inner region 22 is gradually decreased relative to the photocurrent due to the photo-generated holes, whereby the photo-generated holes can be collected to the electrode region 34 at high speed. As the result, the residual image characteristic during a high speed operation can be improved. Further, since the tip end of the inner region 22 is arranged beyond the center of the opening portion OP, the collecting efficiency of the holes in the side of the contact region 8 is improved.

Still further, since the each corner portion of the second semiconductor region 32 and the inner region 22 is formed so as to have an obtuse angle, so that the groove of the potential due to the unevenness of electric field in the corner portions is hardly formed, thereby the residual image characteristic is more improved. Such shape can be easily formed by the pattern of a photomask employed during the exposure of a photoresist.

Further, since the n-type well region 31 is formed in the p-type semiconductor substrate 6 and has a structure that the periphery is surrounded by the p-type well region 7 for each pixel, a crosstalk generated due to the entry of the photocarriers to adjacent pixels can be substantially completely controlled, whereby a high quality resolution pattern can be obtained.

Still further, even when the photocarriers not less than a saturation are stored in a certain pixel, the overflowing photocarriers are absorbed by the surrounding region 7 or the substrate 6. Therefore, a high quality pixel with less bleeding can be formed without giving any influence to other pixels.

According to the present embodiment, although the second semiconductor region 32 and the inner region 22 are shown in the drawings as the regions for forming the photodiode, for instance, a second inner region which further includes the electrode region 34 inside the inner region 22 may be provided and the impurity concentration and the junction depth of the second inner region may be set so as to have the depleting voltage of the second inner region higher than that of the inner region 22, so that a light-receiving element having a low residual image characteristic can be formed.

Embodiment 7

Figure 18:
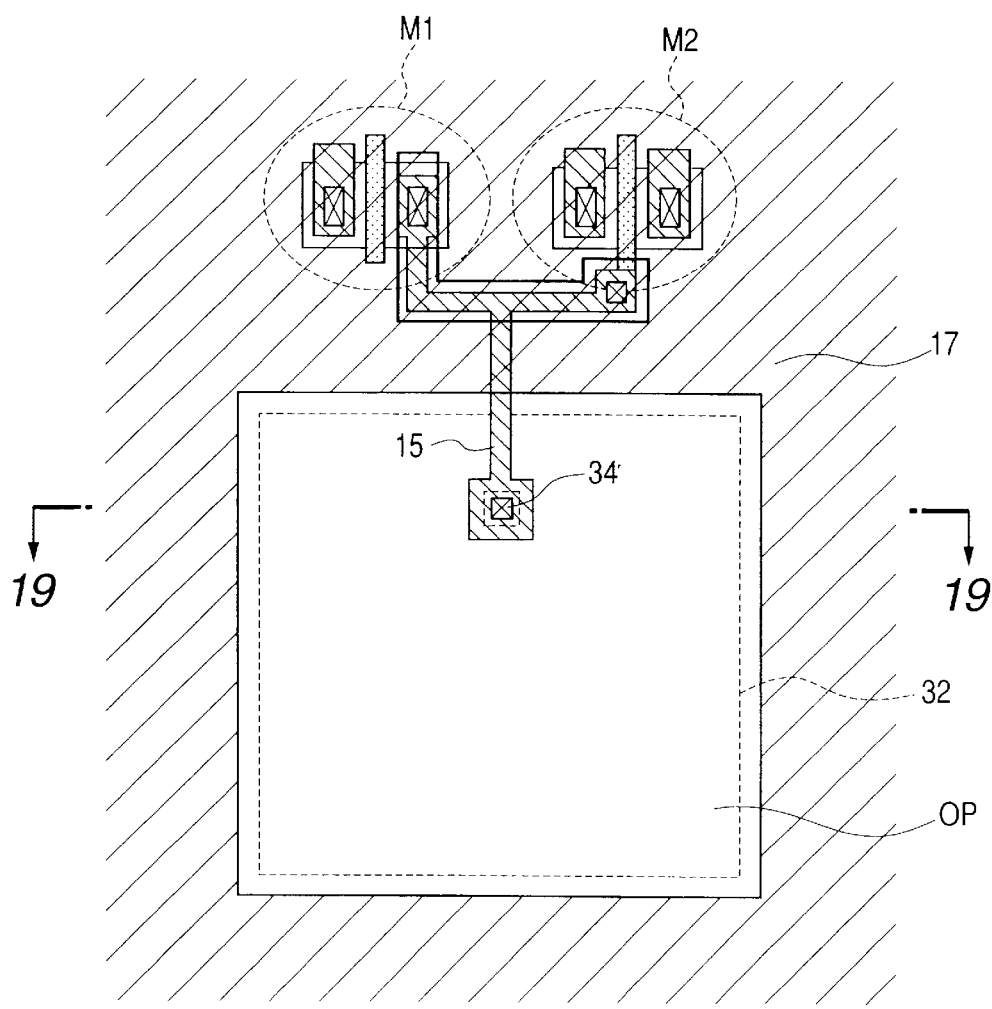
FIG. 18 is a top view of the light-receiving element according to further another embodiment of the present invention.
Figure 19:
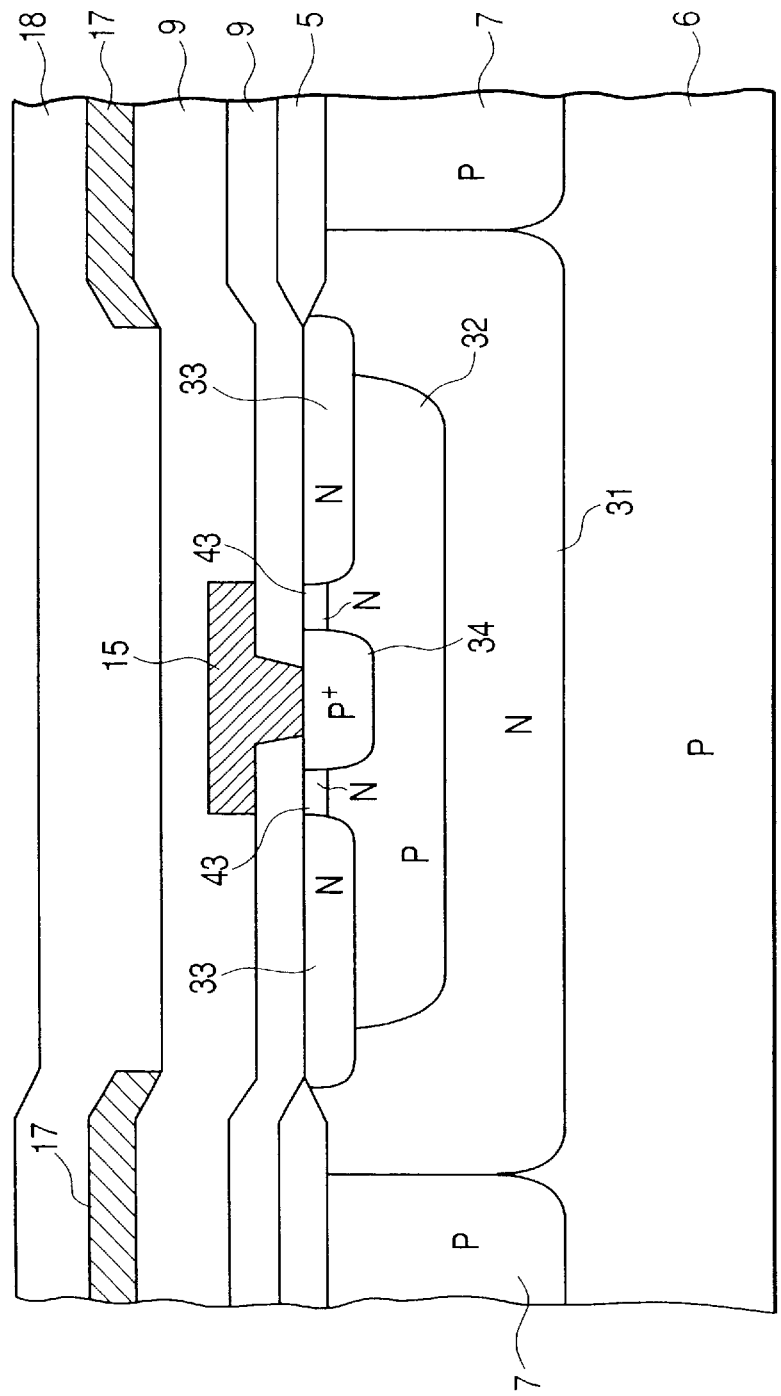
FIG. 19 is a cross-sectional view of the light-receiving element according to further another embodiment of the present invention.
Figure 20A:
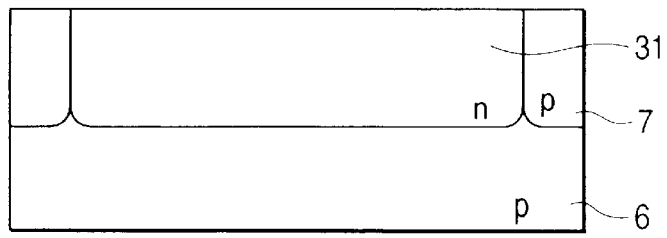
FIGS. 20A, 20B, 20C and 20D are schematically cross-sectional views for showing a method of producing the light-receiving element according to further another embodiment of the present invention.
Figure 20B:
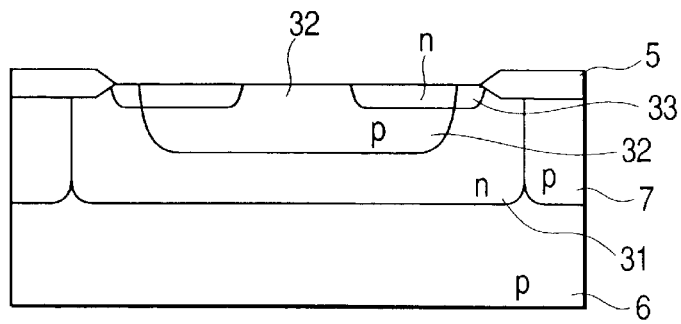
Figure 20C:
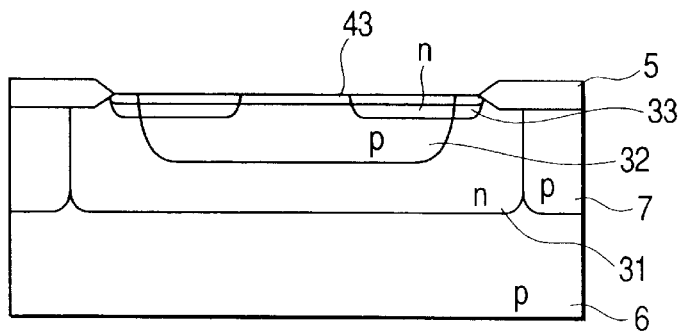
Figure 20D:
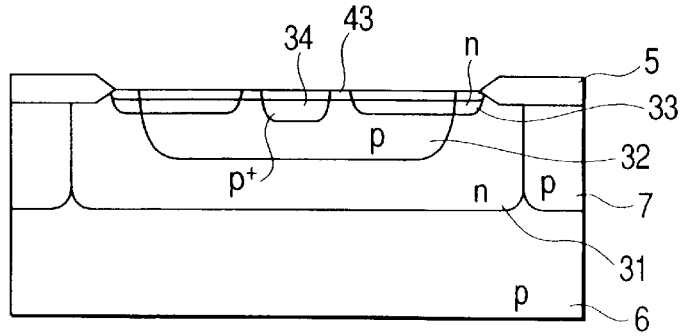

FIG. 18 shows a top view of a light-receiving element according to the seventh embodiment of the present invention. FIG. 19 shows a cross-sectional view taken in the line 19—19 of FIG. 18.

The feature of a light-receiving element according to the seventh embodiment resides in a point that a doped region 43 with a low impurity concentration is formed in an offset region provided between an electrode region 34 and a semiconductor region 33.

Referring to FIGS. 18 and 19, a p-type region serving as the second semiconductor region 32 of a photodiode as a light-receiving element is formed in an opening portion OP. A p$^+$-type region as an electrode region 34 formed in the p-type region 32 of the photodiode is electrically connected to the drain part of a resetting MOS transistor M1 and the gate part of a source follower MOS transistor M2 through a wiring 15 made of a first metal layer. Further, the opening portion OP of the light-receiving element is defined by a light-shielding layer 17 made of a second metal layer. The light-shielding layer 17 is connected to a power source and fixed to a desired potential. Here, the size of the opening portion OP is set to 40 μm×40 μm.

The p-type semiconductor region 32 is formed in the opening portion OP of an n-type well region 31 provided in a p-type semiconductor substrate 6, and the p$^+$-type electrode region 34 is provided in the p-type second semiconductor region 32 in the form of an island.

Further, on the major surface of the p-type region 32, an n-type surface region 33 serving as a third semiconductor region is provided and is electrically connected to the n-type well region 31.

In this case, the n-type surface region 33 is arranged with an offset (space) of about 2 μm not so as to bring it into contact with the p⁺-type electrode region 34. Further, a second n-type surface region 43 is formed on the entire surface of the light-receiving element including this offset region.

Therefore, the photodiode is formed by the pn junction of the p-type semiconductor region 32 and the n-type regions 31, 33 and 43. Photocarriers photoelectrically converted by the photodiode are collected to the p⁺-type electrode region 34 to change the potential of the wiring 15 made of the first metal layer.

Still further, interlayered insulating films 9 are provided between the surface of the semiconductor and the first metal layer and between the first metal layer and the second metal layer, and a protective film 18 is provided on the upper part of the light-shielding layer 17 formed with the second metal layer.

With reference to FIG. 19, the approximate surface concentration and junction depth of the respective regions will be described below.

The p-type substrate 6: about $1 \times 10^{15}$ (cm$^{-3}$);

the n-type well region 31: about $1 \times 10^{17}$ (cm$^{-3}$) and about 4.0 μm;

the p-type second region 32: about $2 \times 10^{17}$ (cm$^{-3}$) and about 0.35 μm;

the first n-type surface region 33: about $3 \times 10^{18}$ (cm$^{-3}$) and about 0.20 μm;

the second n-type surface region 43: about $3 \times 10^{17}$ (cm$^{-3}$) and about 0.1 μm; and the p⁺-type region 34: about $3 \times 10^{19}$ (cm$^{-3}$).

Accordingly, when the second n-type surface region 43 is not present, the vicinity of the surface of the offset region becomes a p-type region with an impurity concentration of $10^{17}$ (cm$^{-3}$) or less. Further, since the concentration of boron in the vicinity of the surface of the semiconductor tends to be varied depending on a production process, carriers generated in the offset region result in generation of a dark current and unevenness in the dark current.

On the other hand, when the p⁺-type region 34 is brought into contact with the first n-type surface region 33 so that the offset region is not formed, reverse bias between the p⁺-type region 34 and the first n-type surface region 33 tends to easily generate a breakdown phenomenon. In this case, the surface concentration of the second n-type surface region 43 is set to $10^{17}$ to $10^{18}$ (cm$^{-3}$) or so, so that even when reverse bias is applied between the p⁺-type region 34 and the first n-type surface region 33, a trouble such as a breakdown will not be generated.

Further, when the offset region is too small, the p⁺-type region 34 is brought into contact with the first n-type surface region 33 with a high probability due to a disalignment in a photolithography, thereby decreasing a yield.

Therefore, since the surface vicinity of the offset region becomes an n-type region with the concentration of about $10^{17}$ (cm$^{-3}$) because of the n-type semiconductor serving as a low concentration-doped region 43, the generation of the carriers in the offset region can be suppressed. For instance, even when the second n-type surface region 43 is formed on the whole surface of a light-receiving part in accordance with an ion-implantation method, this surface region gives substantially seldom any effect to the first n-type surface region 33 and the p⁺-type region 34, because the impurity concentration of the second n-type surface region 43 is sufficiently lower than those of the regions 33 and 34. Since there is no problem of disalignment in the photolithography as described above, the surface concentration of the offset region can be selectively controlled and a dark current can be reduced.

According to the finding of the present inventors of the present invention, as a result of measuring the dark current, the dark current obtained when there exists the second n-type surface region 43 is reduced by ⅓ times lower than that obtained when the surface region 43 is not provided.

Here, the depleting voltage of the semiconductor region 32 according to the seventh embodiment of the present invention is about −2V. Therefore, for example, when the n-type well region 31 is connected a source voltage during an operation under the source voltage of 5V, when the potentials of the p⁺-type region 34 and the wiring 15 are 3V or lower, the p-type region 32 is depleted and thereby a neutral region disappears.

The above-described depleting voltage sensitively changes mainly relative to the impurity concentration and the junction depth of each of the n-type well region 31, the p-type region 32 and the first n-type surface region 33. Accordingly, the unevenness of the depleting voltage in production is relatively increased, for example, by about ± 1.0V for ±3σ. However, when the depleting voltage and an operating point are set in a suitable range, a high yield can be maintained even in the case of unevenness in the depletion voltage.

According to the present embodiment, although the n-type surface region 43 is provided in order to suppress the generation of the carriers on the surface of the offset region, it is possible to provide the second surface region, which is not limited to n-type, and a p-type second surface region may be provided so that the suppression of the dark current can be also realized. In this case, the p-type neutral region is increased. When there remains an allowance in the capacitance of the light-receiving portion in view of design, the surface region may be made p-type. In either case, the impurity concentration in the offset region may be set in a range of about $10^{16}$ to $10^{18}$ cm$^{-3}$ more preferably, in a range of $5 \times 10^{16}$ to $5 \times 10^{17}$ cm$^{-3}$ from the viewpoints of the decrease of the dark current and the prevention of the breakdown.

The n-type well region 31 is formed in the p-type substrate 6 and has a structure in which the periphery of the n-type well region 31 is surrounded by a p-type well region 7 for each pixel.

Now, a method of producing the light-receiving element according to the seventh embodiment of the present invention will be described by referring to FIGS. 20A to 20D.

An n-type well region 31 and a p-type region 7 are formed on the surface side of a p-type semiconductor substrate 6.

Then, a field insulating film 5 is formed by selective oxidation.

After a p-type semiconductor region 32 functioning as a photodiode is formed inside a region surrounded by the field insulating film 5, an n-type semiconductor region 33 is formed on the surface thereof.

Ion-implantation is applied to the surface of the semiconductor substrate to form an n-type semiconductor layer 43. Then, a p-type electrode region 34 is formed.

In this case, a space between the electrode region 34 and the semiconductor region 33 (in other words, a width of the offset region) is preferably set in a range of 0.4 μm to 1.5 μm, and more preferably in a range of 0.5 μm to 1.0 μm. The impurity concentration of the offset region is set to a concentration lower, by one figure or more, than that of the semiconductor region 33 or the electrode region 34, and further higher than that of the semiconductor region 32.

Now, another form of the read and reset circuit employed in the present invention will be described referring to FIGS. 21 and 22.

Figure 21:
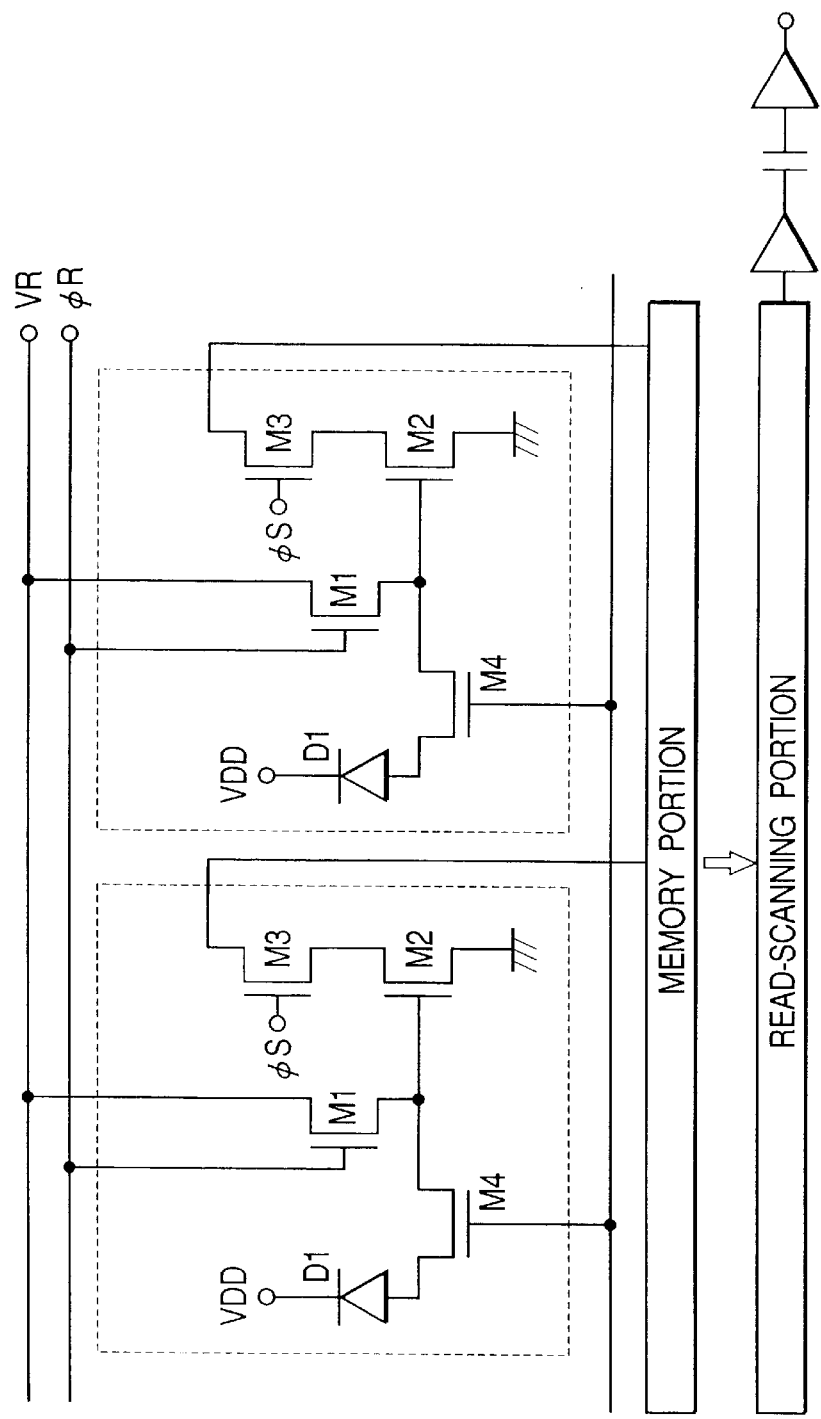
FIG. 21 is a circuit diagram of a read circuit and a reset circuit employed in the present invention.

FIG. 21 shows a circuit diagram of the read and reset circuit.

In FIG. 21, D1 denotes a photodiode functioning as a light-receiving element according to each of the respective embodiments of the present invention. M2 and a constant-current source which is not shown in FIG. 21 constitute a source follower as a pair. M1 denotes a resetting switch. M3 indicates a selecting switch. M4 denotes a transfer switch for transferring signals of the photodiode as photocharges to the input terminal of the source follower.

The photosignals and reset signals read from the source follower are respectively transferred to a memory portion and outputted to an external part through a scanning circuit or the like.

According to the seventh embodiment of the present invention, the area of the electrode is specially restricted to 1 μm square, so that the junction capacitance can be restricted to 0.1 fF. As a consequence, a solid image pick-up apparatus can be provided with a high yield, in which reset noise can be suppressed to four electrons or so and a residual image is not formed even within a dynamic range of 10 bits.

Now, a still another read and reset circuit employed in the present invention will be described hereinafter. This read and reset circuit is disclosed by Japanese Patent Application Laid-Open No. 9-205588.

Figure 22:
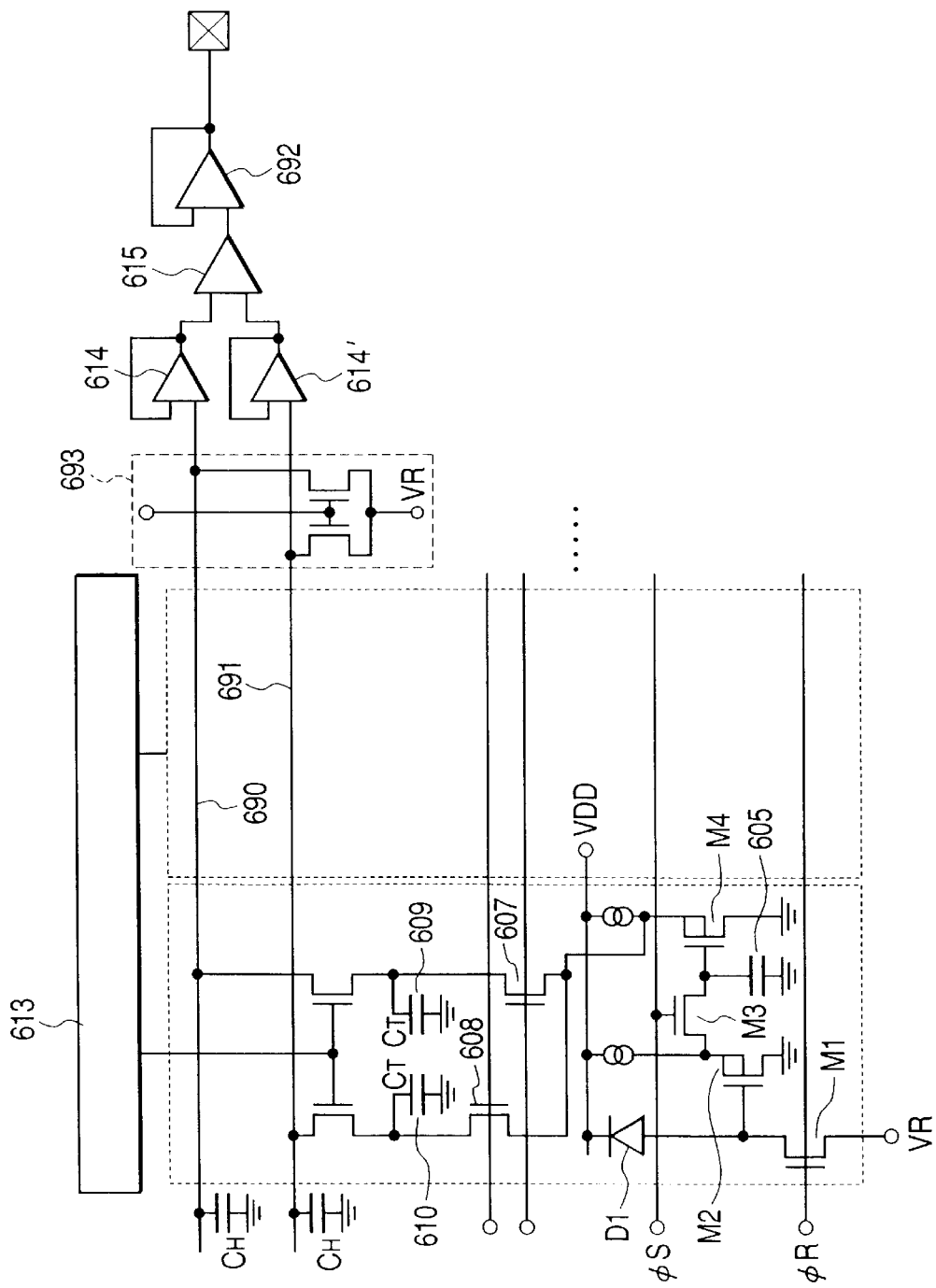
FIG. 22 is a circuit diagram of a read circuit and a reset circuit employed in the present invention.

FIG. 22 is an equivalent circuit of one pixel of the read and reset circuit.

Referring to FIG. 22, here, in the read and reset circuit, each pixel comprises a light-receiving element D1, a resetting MOS switch M1 for resetting the light-receiving element D1, a first MOS source follower M2 for converting a signal charge of the light-receiving element D1 to a voltage signal, a MOS switch M3 for holding a noise signal during the storage period of the noise signal upon reset of the light-receiving element D1, a retention capacitance 605, a second MOS source follower M4 for conducting impedance conversion of the signal of the retention capacitance 605, a MOS switch 607 for reading a noise signal charge immediately after a reset operation, a noise signal retention capacitance 609, a MOS switch 608 for reading photosignal charges after the photosignals are stored and a photosignal retention capacitance 610.

Further, the read and reset circuit includes a shift register 613 for successively reading out the noise signal of the noise signal retention capacitance 609 and the photosignal of the photosignal retention capacitance 610 to a common noise signal output line 690 and a common optical signal output line 691, respectively; buffer amplifiers 614 and 614' for conducting impedance conversion of voltages of the common noise signal output line 690 and the common photosignal output line 691; a differential amplifier 615 for obtaining the differential signal of the voltage of the common noise signal output line 690 and the common photosignal output line 691 and amplifying the differential signal and an output buffer amplifier 692 for conducting impedance conversion of the output of the differential amplifier 615 and outputting the signal thus obtained to the external part of a photoelectric conversion device. Further, the read and reset circuit includes a common output line reset means 693 for resetting the common noise signal output line 690 and the common photosignal output line 691 for each reading operation of one pixel.

The photooutput voltage VP of the photoelectric conversion device shown in FIG. 22 is expressed by the following formula (3):

$$V_P = \frac{Q_P}{C_{PD}} \times Gsf1 \times Gsf2 \times \frac{C_T}{C_T + C_H} \times Gamp \quad (3)$$

wherein symbol QP denotes a photosignal charge;
CPD: a capacitance of the light-receiving portion;
Gsf1: a gain of the first source follower M2;
Gsf2: a gain of the second source follower M4;
CT: a capacitance value of noise signal and photosignal storage capacitance;
CH: a capacitance value of the common output line of noise signal and photosignal; and
Gamp: a gain of the differential amplifier 615.

In FIG. 22, when V1PD is the potential of the light-receiving element portion immediately after the light-receiving element is reset and V2PD is the potential of the light-receiving element portion after photocharges are stored, the above-described formula (3) can be expressed by the following formula (4):

$$V2_{PD} - V1_{PD} = \Delta V_{PD} = \frac{Q_P}{C_{PD}} \quad (4)$$

$$= \frac{V_P}{Gsf1 \times Gsf2 \times \frac{C_T}{C_T + C_H} \times Gamp}$$

wherein ΔVPD indicates the change of the potential the light-receiving element portion due to the photocharge.

Accordingly, in the above-described formula (4), V1PD and V2PD are set to a depletion region in the light-receiving element portion, so that the photoelectric conversion device with a high sensitivity can be realized.

According to the present embodiment, in each of the above-described formulas, the respective items are set as described below:

Gsf1=Gsf2=0.9;
CT/(CT+CH)=0.5;
Gamp=20;
Power voltage (VDD): 5V;
Depleting voltage of light-receiving element: −2V;
Saturation voltage of optical output (Vp): 2V; and
Reset voltage (VR) of light-receiving element: 1V.

Accordingly, from the above-described respective formulas, the following values can be obtained:

(a) the potential (V1PD) of light-receiving element portion just after reset: about 0.70V; and (b) the potential (V2PD) of light-receiving element portion at the time of saturation output: about 0.95V.

It can be found from the values of the above-described power voltage and depleting voltage that, when the potential of the light-receiving element portion is 3V or less, the light-receiving element portion becomes a depleted state.

As apparent from the above (a) and (b), since both the potential (VLPD) of the light-receiving element portion just after the reset operation and the potential (V2PD) of the light-receiving element portion at the time of saturation output are 3V or less, a small range of the capacitance of the light-receiving portion located can be used with a high sensitivity.

As a result of measuring the capacitance of the light-receiving portion, the total of the junction capacitance of the electrode region of the light-receiving element, the capacitance of the gate of the source follower MOS, the junction capacitance of the drain part of the reset MOS and a parasitic capacitance such as a wiring capacitance or the like is about 25 fF.

Further, in the present embodiment, when the unevenness of the depleting voltage is within a range of −2V ± 2V or so, the depleting region of the light-receiving element portion is in a range of 1V to 5V. However, since the operating point in the present embodiment is a point smaller than 1V which is a minimum value of the depleting region, even when the depleting voltage has the unevenness of about ±2V, a high yield can be maintained.

As described above, the potential of the light-receiving element portion just after the resetting operation is smaller than the reset voltage (Vres), because an NMOS is employed for the reset switch and the potential of the light-receiving element portion is shifted to a minus side when the reset switch is turned off.

Further, although in the seventh embodiment there is described one example in which the present invention is applied to the photoelectric conversion device as proposed by the present inventors in Japanese Patent Application Laid-Open No. 9-205588, the present invention is not limited to the present embodiment and may be applied to other photoelectric conversion devices or solid image pick-up devices.

According to the present embodiment, 344 pieces of pixels each having the above-described structure are provided to form a primary photoelectric conversion device, which is not shown in the drawings.

The photoelectric conversion device according to the present embodiment is employed to constitute a contact type image sensor, and it is used as the image reading device of an image input system such as a facsimile machine or an image scanner. Thus, since the good residual-image characteristic can be obtained even at the time of high speed operation, high-quality image reading can be realized. Further, the image reading device can be provided at a low cost because of its high yield.

Embodiment 8

Now, the eighth embodiment of the present invention will be described below by referring to FIGS. 23A and 23B.

Figure 23A:
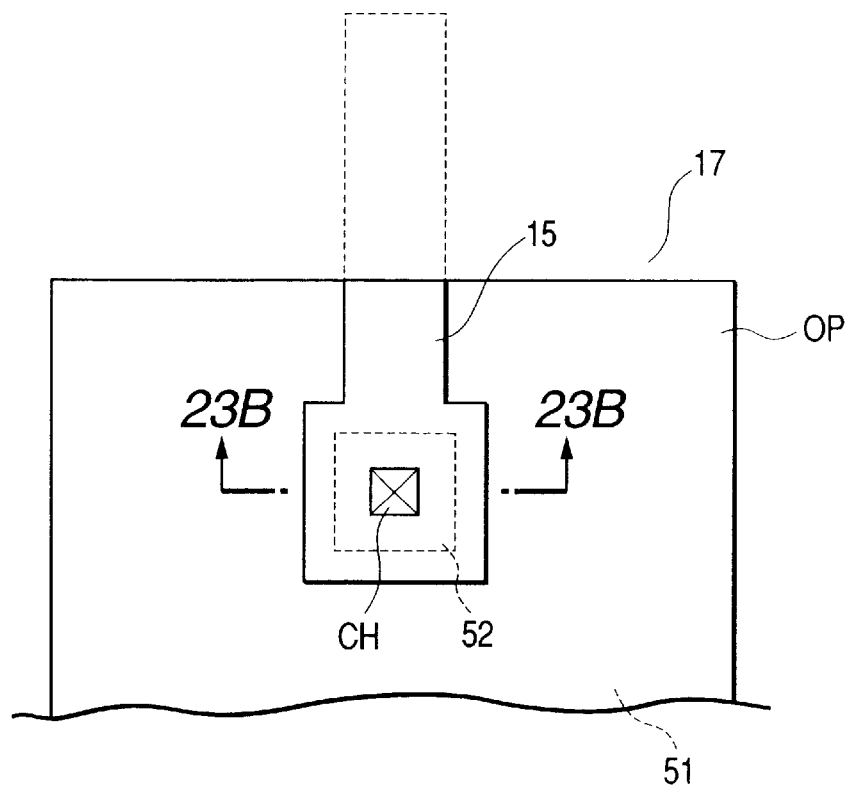
FIG. 23A is a top view of the light-receiving element according to further another embodiment of the present invention.

FIG. 23A shows a top view of a light-receiving element portion according to the eighth embodiment. FIG. 23B shows a cross-sectional view taken in the line 23B—23B of FIG. 23A.

Figure 23B:
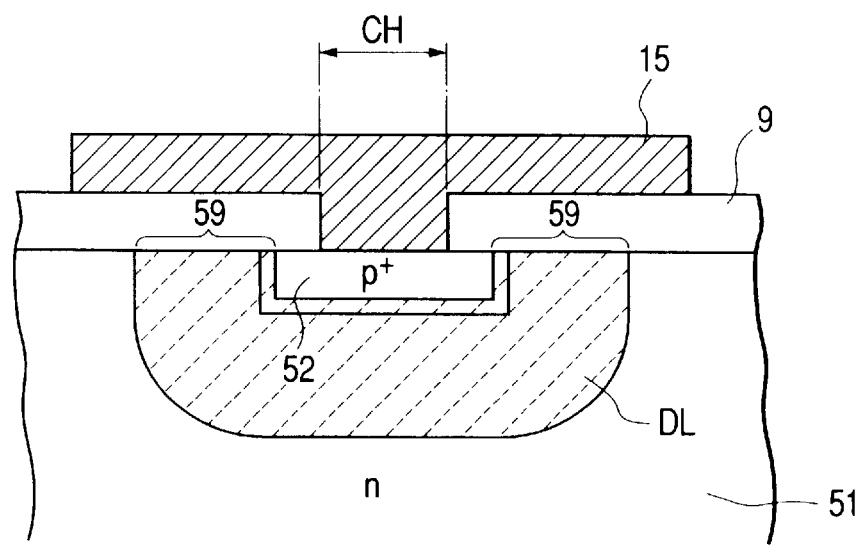
FIG. 23B is a cross-sectional view of the light-receiving element according to further another embodiment of the present invention.

In FIGS. 23A and 23B, reference numeral 51 denotes a first semiconductor region, and 52 indicates a second semiconductor region. Here, the conductivity types of these regions are n-type and p-type, respectively. Further, the second semiconductor region 52 is formed in an opening portion OP defined by a light-shielding layer 17.

Further, a depletion layer DL is formed by the pn junction of the first semiconductor region 51 and the second semiconductor region 52. Reverse bias is applied between the first semiconductor region 51 and the second semiconductor region 52, and the larger portion of the depletion layer DL is extended to the side of the first semiconductor region 51 having a low impurity concentration. An electrode 15 is connected to the second semiconductor region 52 through the contact hole CH of an insulating film 9.

When a light-receiving element is irradiated with light, electric charges are generated in the depletion layer DL and in the periphery thereof. The electric charges are collected to the second semiconductor region 52. Many crystal defects are present in an interface between the major surface of the semiconductor substrate and the insulating film 9. The crystal defects cause a level state for generating a pair of an electron and a positive hole, thereby generating a dark current. Particularly, the generation of the dark current greatly depends on the crystal defects in the vicinity of the depletion layer DL.

In the case of forming the electrode 15, when an edge of the electrode is not extended to an outer position where the depletion layer DL is contiguous to the insulating film 9, the quantity of the crystal defects is increased due to a damage in an etching process and the quantity of the dark current is increased.

Thus, in the structure of the light-receiving element according to the eighth embodiment of the present invention, a portion 59 where the depletion layer DL is brought into contact with the insulating film 9 is covered with the electrode 15 through the insulating film 9. Therefore, the etching damage in formation of the electrode gives no influence on the depletion layer DL, so that dark current can be reduced.

Further, the electrode 15 is designed to be always formed in the portion 59 where the depletion layer DL is brought into contact with the insulating film 9 by taking disalignment generated in photolithography into consideration. Accordingly, the quantity of the crystal defects generated in the vicinity of the depletion layer DL can be prevented from being varied depending on process unevenness. Therefore, the unevenness of the dark current due to the process unevenness can be lowered.

According to the eighth embodiment of the invention, as materials for the electrode 15, metals, alloys and compounds such as Al, Al alloys, Ti, Ti alloys, W, W alloys, Co, Co alloys, Ta, Ta alloys, Mo, Mo alloys, Cu, Cu alloys, WN, TiN, TaN, Cr, Cr alloys, etc. may be employed. Otherwise, a plurality of kinds of materials may be laminated. For instance, it is possible to use as the material for the electrode electrically conductive materials, for example, a material containing silicon as a main component such as doped polysilicon.

Embodiment 9

Figure 24A:
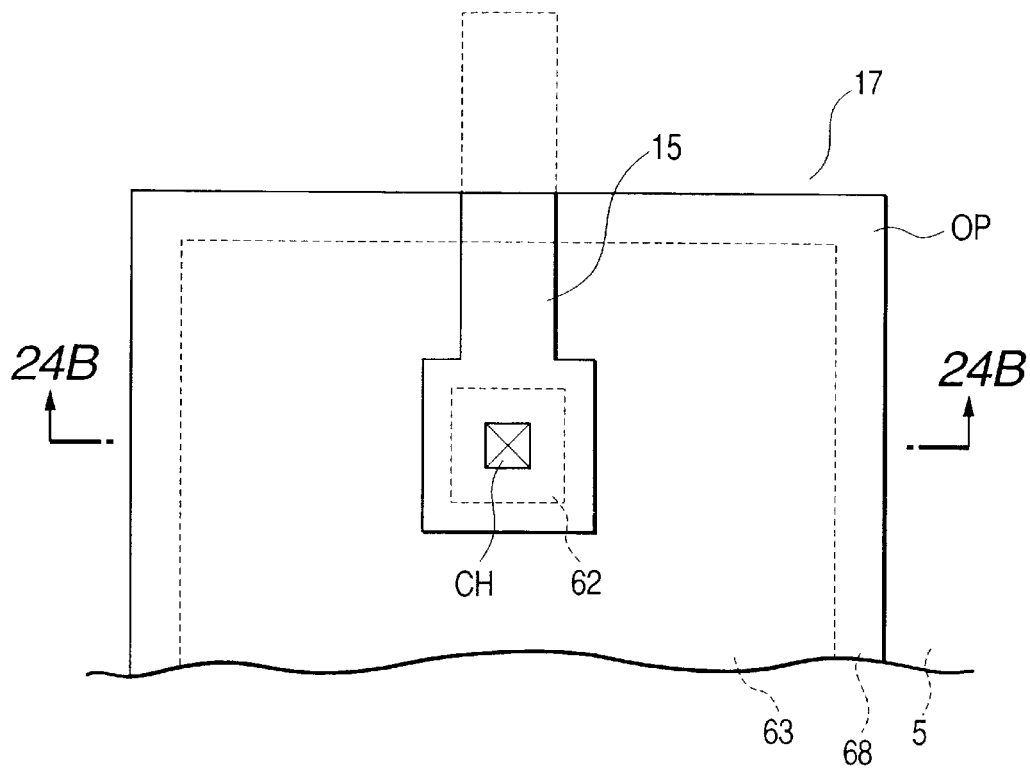
FIG. 24A is a top view of the light-receiving element according to further another embodiment of the present invention.
Figure 24B:
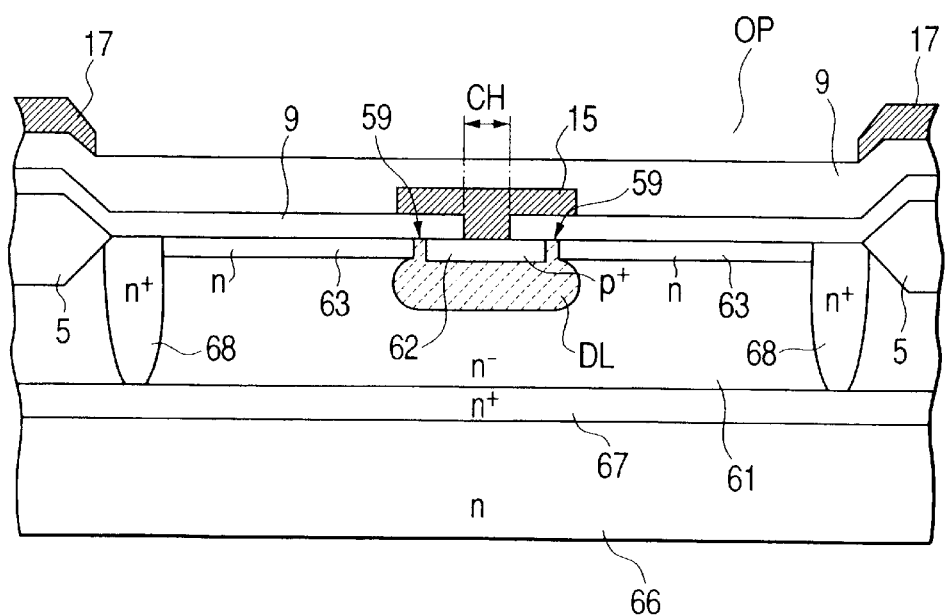
FIG. 24B is a cross-sectional view of the light-receiving element according to further another embodiment of the present invention.

FIG. 24A shows a top view of a light-receiving element and FIG. 24B shows a cross-sectional view taken in the line 24B—24B of FIG. 24A. Reference numeral 66 denotes an n-type semiconductor substrate, 67 indicates an embedded $n^+$-type region formed by implanting ions into the n-type semiconductor substrate 66. 61 denotes an n-type epitaxial layer as a first semiconductor region formed on the $n^+$-type region 67. 68 denotes an $n^+$-type region in contact with the embedded $n^+$-type region, which is formed by implanting ions into the $n^-$-type epitaxial layer 61.

Further, reference numeral 62 denotes a second semiconductor region and an electrode region which is specifically composed of a p-type region with a high concentration of impurities. 63 indicates an n-type region which is provided in order to suppress the spread of the a depletion layer DL on the major surface of the substrate, that is to say, the surface of the epitaxial layer. The electrode 15 formed with a metal or the like including Al as a main material is electrically connected to the electrode region 62 through the contact hole CH of an insulating film 9. Further, 17 indicates a light-shielding layer. OP indicates an opening portion. 5 denotes an insulating film for isolating the element. 9 denotes an interlayered insulating film for insulating the light-shielding layer 17 and an electrode 28.

According to the ninth embodiment of the present invention, the semiconductor portion composed of the n-type semiconductor substrate 66, the n$^+$-type region 67, the n$^-$-type epitaxial layer 61, the n$^+$-type region 68, the n-type region 63 and the electrode region 62 is referred to as "substrate".

The n$^-$-type epitaxial layer 61 has a structure that it is surrounded by the n$^+$-type regions 67 and 68 located under the lower portion and in the periphery thereof. Thus, a potential barrier is formed. As a result, positive holes of carriers generated by light are finally collected to the p-type electrode region 62 having the lowest potential.

The depletion layer DL is formed around the electrode region 62. Here, the impurity concentration of the electrode region 62 is set to about $3 \times 10^{19}$ cm$^{-3}$ and the impurity concentration of the n-type region 63 is set to about $2 \times 10^{17}$ cm$^{-3}$. When the reverse bias voltage of 3V is applied thereto, the width of layer of the depletion layer DL becomes approximately 0.14 μm. Most of the depletion layer DL is expanded to the side of the n$^-$-type region 61 from the pn junction surface of the electrode region 62 and the n$^-$-type region 61. On the other hand, on the surface of the substrate, the extension of the depletion layer DL is suppressed by the n-type region 63.

The electrode 15 is arranged so as to be larger, for instance, by 0.4 μm than the electrode region 62 so that the upper side of a portion where the depletion layer DL comes into contact with the insulating film 9 is covered with the electrode. Therefore, crystal defects generated owing to an etching damage or a damage due to ashing of a resist upon formation of the electrode 15 give no adverse effect to the depletion layer DL, so that a dark current can be reduced.

As a result of comparison between the dark current generated when the electrode 15 is formed so as to cover the portion 59 where the depletion layer DL comes into contact with the insulating film 9 is covered with the electrode and the dark current generated when the electrode is not formed so, the dark current generated when the upper part of the portion where the depletion layer DL comes into contact with the insulating film 9 is completely covered with the electrode 15 can be reduced to ⅔ as low as that of the latter. In other words, the dark current can be reduced depending on the size and the formed position of the electrode 15.

For the purpose of simplifying the explanation, although the semiconductor substrate 66 and the regions 67 and 68, the epitaxial layer 61 and the region 63 are determined to be the n-types, and the region 62 is determined to be the p-type, needless to say, the present embodiment of the present invention is not limited to the above-described conductivity types, and each of the above-described conductivity types may be changed to an opposite conductivity type.

Further, according to the ninth embodiment of the present invention, the n$^-$-type epitaxial layer 61 has a structure that it is surrounded by the n$^+$-type regions 67 and 68 to form the potential barrier. Thus, the photocarriers do not enter adjacent pixels, so that the generation of a crosstalk can be substantially completely controlled and a high quality resolution pattern can be thus obtained.

Embodiment 10

Figure 25A:
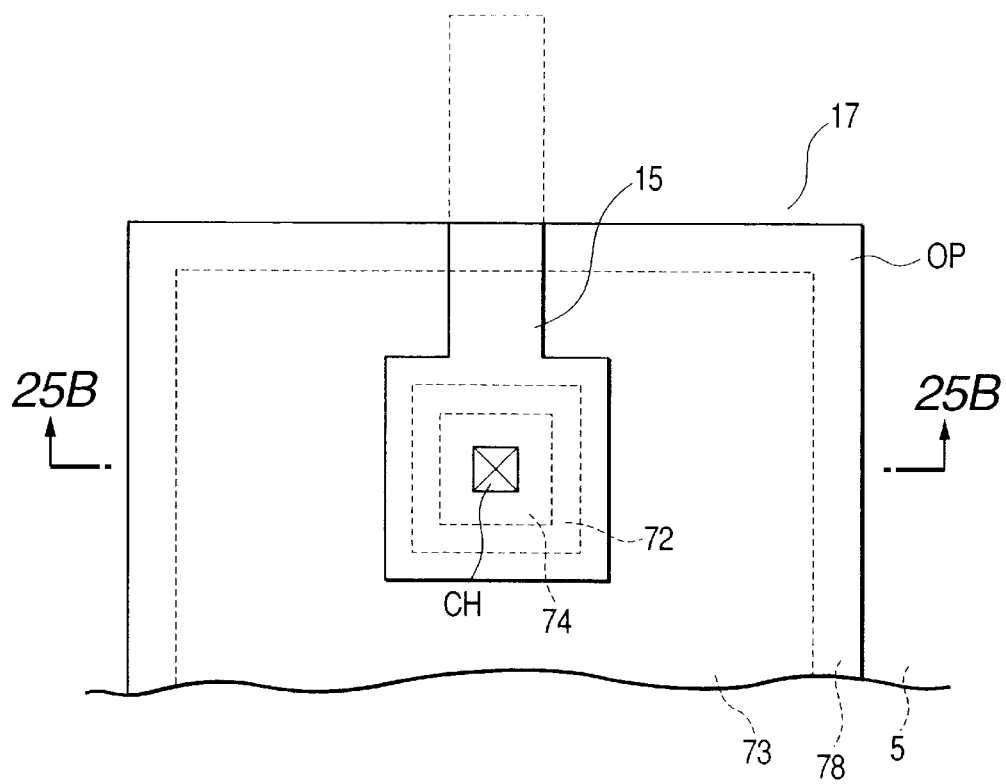
FIG. 25A is a top view of the light-receiving element according to further another embodiment of the present invention.
Figure 25B:
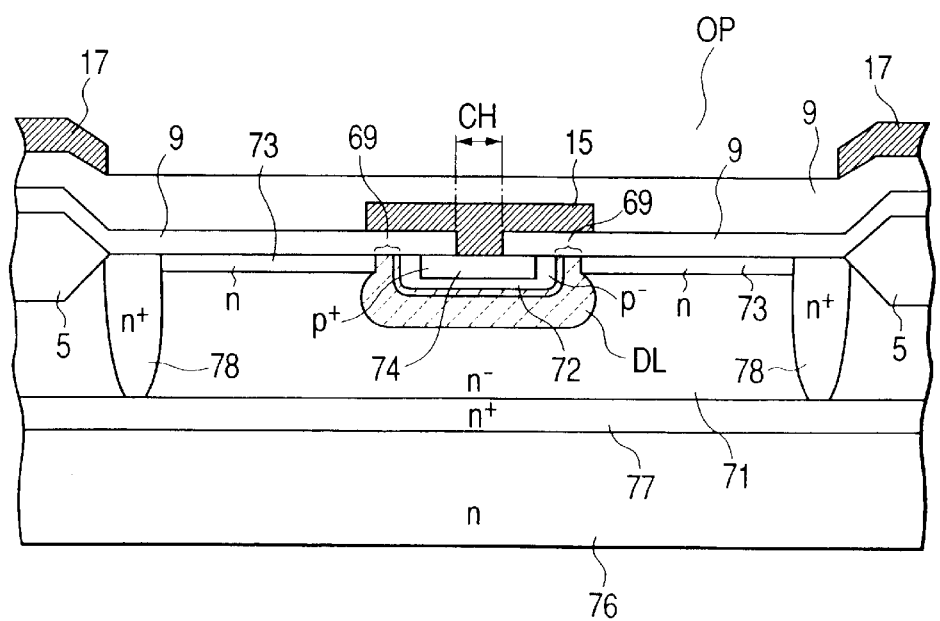
FIG. 25B is a cross-sectional view of the light-receiving element according to further another embodiment of the present invention.

FIG. 25A shows a top view of a light-receiving element and FIG. 25B shows a cross-sectional view taken in the line 25B—25B of FIG. 25A. Referring to FIGS. 25A and 25B, reference numeral 76 denotes an n-type semiconductor substrate. 77 denotes an embedded n$^+$-type region formed by implanting ions into the n-type semiconductor region 76. 71 is an n$^-$-type epitaxial layer as a first semiconductor region formed on the n$^+$-type region 77. 78 denotes an n$^+$-type region formed by implanting ions into the n$^-$-type epitaxial layer and surrounding the periphery of the epitaxial layer 71.

Further, 72 indicates a second semiconductor region. 74 denotes an electrode region which is specifically composed of a p-type region with a high concentration of impurities. 73 denotes an n-type region provided for suppressing the extension of a depletion layer DL on the major surface of the substrate. 15 indicates an electrode and is formed with a metal or the like including Al as a main material. The electrode 15 is electrically connected to the electrode region 74 through the contact hole CH of an insulating film 9.

In the case of finely dividing the electrode region 74, when the depletion layer DL is expanded to the electrode region having a high impurity concentration, a dark current is undesirably increased due to defects existing in the depletion layer. A p-type semiconductor region 72 is provided in order to suppress this phenomenon. In addition, OP denotes an opening portion. 5 denotes an insulating film for isolating the element. An upper interlayered insulating film 9 functions as an insulating film for insulating a light-shielding layer 17 and an electrode 15.

According to the tenth embodiment of the present invention, the portion composed of the n-type semiconductor substrate 76, the n$^+$-type region 77, the n$^-$-type epitaxial layer 71, the n$^+$-type region 78, the n-type region 73 and the electrode region 74 is referred to as "substrate".

The n$^-$-type epitaxial layer 71 has a structure that it is surrounded by the n$^+$-type regions 77 and 78. Thus, a potential barrier is formed. As a result, positive holes of carriers generated by light are finally collected to the p-type electrode region 74 having the lowest potential.

The depletion layer DL is formed around the p-type region 72. Here, the impurity concentration of the p-type region 72 is set to about $3 \times 10^{18}$ cm$^{-3}$ and the impurity concentration of the n-type region 73 is set to about $2 \times 10^{17}$ cm$^{-3}$, and when the reverse bias voltage of 3V is applied thereto, the width of layer of the depletion layer DL becomes approximately 0.15 μm. Most of the depletion layer DL is expanded to the side of the n-type region 71 from the pn junction surface of the p-type region 72 and the n-type region 71.

The electrode 15 is arranged so as to be larger, for instance, by 0.4 μm than the p-type region 72 so that a portion 69 where the depletion layer DL comes into contact with the insulating film 9 is covered with the electrode. Therefore, crystal defects generated on the surface of the substrate owing to an etching damage or a damage due to ashing of a resist upon formation of the electrode 15 give no adverse effect to the depletion layer DL, so that a dark current can be reduced.

For the purpose of simplifying the explanation, although the substrate 76 and the regions 77 and 78, the epitaxial layer 71 and the region 73 are determined to be the n-types, and the regions 72 and 74 are determined to be p-types, needless to say, the present embodiment of the present invention is not limited to these conductivity types, and each of these conductivity types may be changed to an opposite conductivity type.

Embodiment 11

Figure 26A:
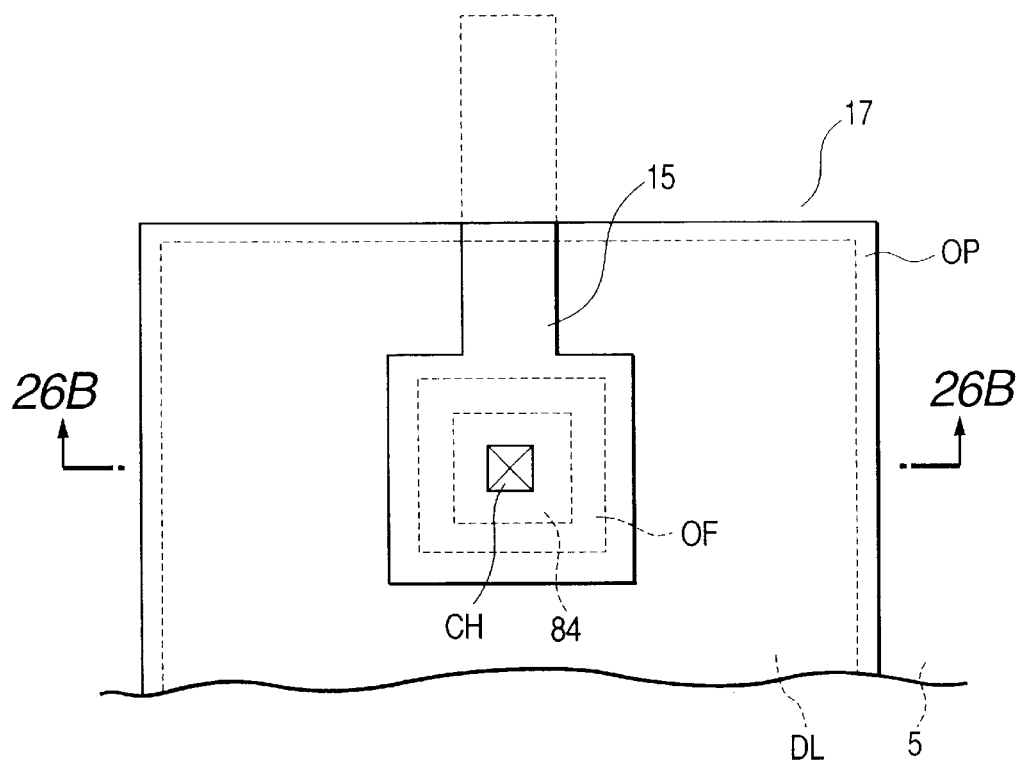
FIG. 26A is a top view of the light-receiving element according to further another embodiment of the present invention.
Figure 26B:
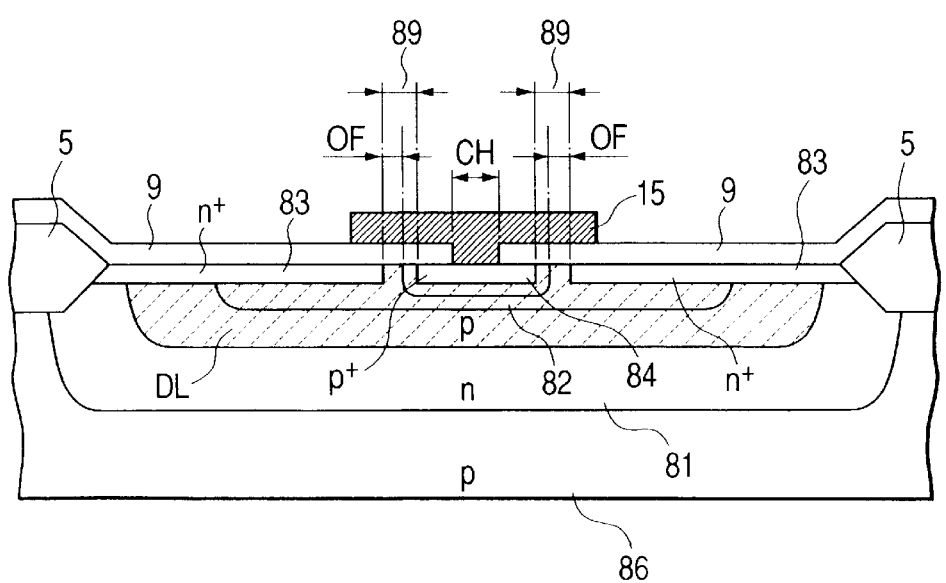
FIG. 26B is a cross-sectional view of the light-receiving element according to further another embodiment of the present invention.

FIG. 26A shows a top view of a light-receiving element according to the eleventh embodiment and FIG. 26B shows a cross-sectional view taken in the line 26B—26B of FIG. 26A. In FIGS. 26A and 26B, reference numeral 86 denotes a p-type semiconductor substrate. 81 denotes an n-type region serving as a first semiconductor region. 82 denotes a p-type region serving as a second semiconductor region. 83 denotes an n$^+$-type region serving as a third semiconductor region.

Further, 84 is a p-type region which is an electrode region with a high concentration of impurities, that is to say, is composed of a p$^+$-type region. The p$^+$-type region 84 is arranged on the major surface of the substrate via the n$^+$-type region 83 and an offset region OF disposed therebetween. 15 denotes an electrode formed with a metal or the like including Al as a main component. The electrode 15 is electrically connected to the p$^+$-type region 84 through the contact hole CH of an insulating film 9 formed on the major surface of the p-type substrate 86. DL denotes a depletion layer.

The p-type region 82 is interposed between the n-type region 81 and the n$^+$-type region 83. Thereby, the depletion layers DL are formed by a pn junction in the lower surface side and by a pn junction in the upper surface side of the p-type region 82, and a state of a groove with a low potential in the semiconductor region 82.

As a result, the positive holes of electric charges generated by light are collected to the p-type region 82, and finally collected to the p$^+$-type region 84 having the lowest potential. Further, mainly, the impurity concentration of the n-type region 81, the impurity concentration and the junction depth of the p-type region 82 and the n$^+$-type region 83 as well as the bias voltage of the pn junctions thereof are properly set, whereby the substantially entire part of the n-type region 81 can be also depleted. As a consequence, the p-type region 82 hardly contributes to the capacitance of the light-receiving element, hence the capacitance of the light-receiving element can be reduced.

When the offset region OF is not formed and the electrode region 84 is made to come into contact with the n$^+$-type region 83, reverse bias is applied between the electrode region 84 and the n$^+$-type region 83 to cause a breakdown phenomenon, thereby supplying a large quantity of a leakage current to the p$^+$-type electrode region 84.

Further, when the offset region OF is too small, the p$^+$-type region 84 comes into contact with the n$^+$-type region 83 with a high probability due to disalignment or the like in photolithography. This results in the decrease of the yield of the light-receiving element. Therefore, according to the eleventh embodiment of the present invention, the offset regions OF of 1 $\mu$m are provided between the p$^+$-type region 84 and the n$^+$-type region 83 at the right side and between the p$^+$-type region 84 and the n$^+$-type regions 83 at the left side, respectively.

The electrode 15 is formed so as to cover a portion 89 in which the depletion layer DL comes into contact with the insulating film 9 with the electrode. Therefore, crystal defects formed on the surface of the substrate due to an etching damage or a damage owing to the ashing process of a resist upon formation of the electrode 15 do not apply any influence to the deplation layer DL, so that the dark current can be reduced.

The present embodiment of the present invention is not limited to the above-described conductivity types, and each of the conductivity types employed in the present embodiment may be changed to an opposite conductivity type.

Further, according to the eleventh embodiment of the present invention, since the n-type region 81 is formed in the p-type substrate 86, the photocarriers can be prevented from entering adjacent pixels. Therefore, the generation of a crosstalk can be substantially completely controlled, so that a high quality resolution pattern can be realized.

Still further, even when the photocarriers of a storage saturation value or more are generated in a certain pixel, overflowing photocarriers are absorbed by the p-type region 86 located in the periphery of the n-type region 81, so that a high quality image having no bleeding can be obtained without giving any influence to other pixels.

Referring to FIGS. 27A to 27C and 28A to 28C, a method of producing the light-receiving element according to the eleventh embodiment of the present invention will be described hereinafter.

Figure 27A:
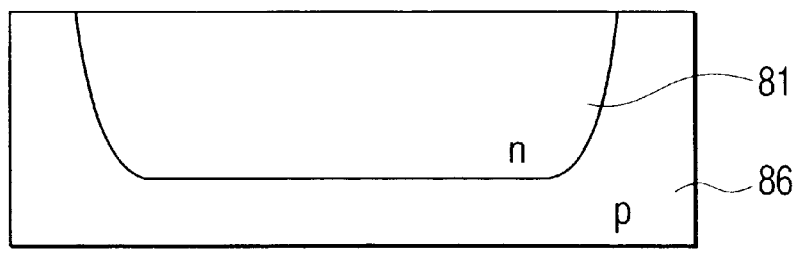
FIGS. 27A, 27B and 27C are schematically cross-sectional views for showing one example of a method of producing the light-receiving element according to further another embodiment of the present invention.

Initially, the p-type semiconductor substrate 86 is prepared and the n-type region 81 composed of the n-type semiconductor is formed (see FIG. 27A).

Figure 27B:
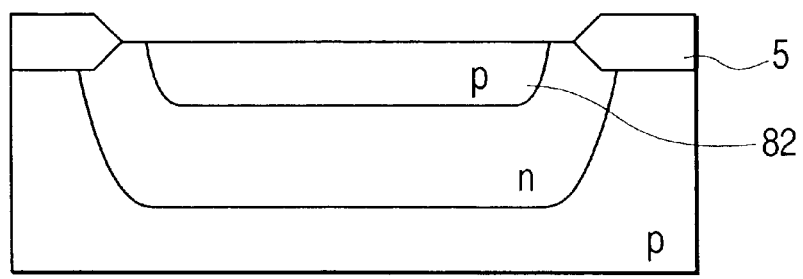
Figure 27C:
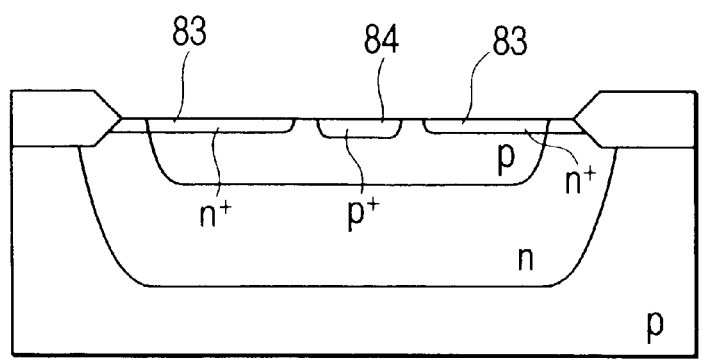

Then, a field insulating film 5 is formed in accordance with a selective oxidation method, and then, the p-type semiconductor region 82 is formed (see FIG. 27B).

After the n-type semiconductor region 83 is formed, the p-type electrode region 84 is formed. In this case, as occasion demands, the offset region between the n-type semiconductor region 83 and the electrode region 84 may be implanted by dopant ions with a low impurity concentration (see FIG. 27C).

Figure 28A:
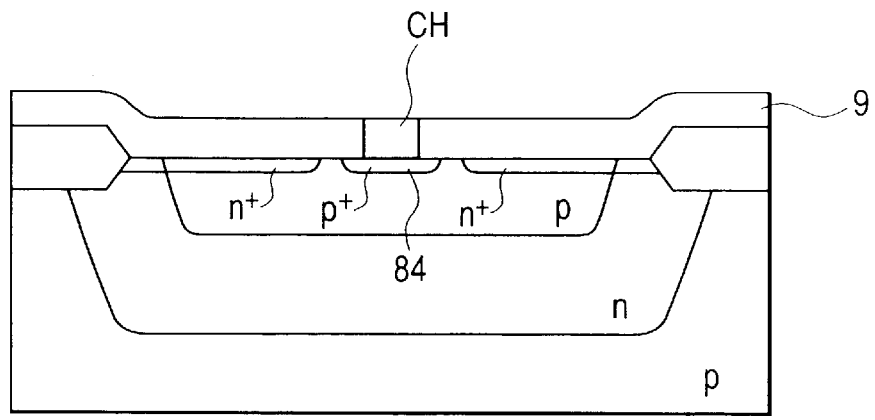
FIGS. 28A, 28B and 28C are schematically cross-sectional views for showing one example of a method of producing the light-receiving element according to further another embodiment of the present invention.

Next, the insulating film 9 composed of PSG, BSG, BPSG or the like is formed, and the opening CH is formed on the electrode region 84 (see FIG. 28A).

Figure 28B:
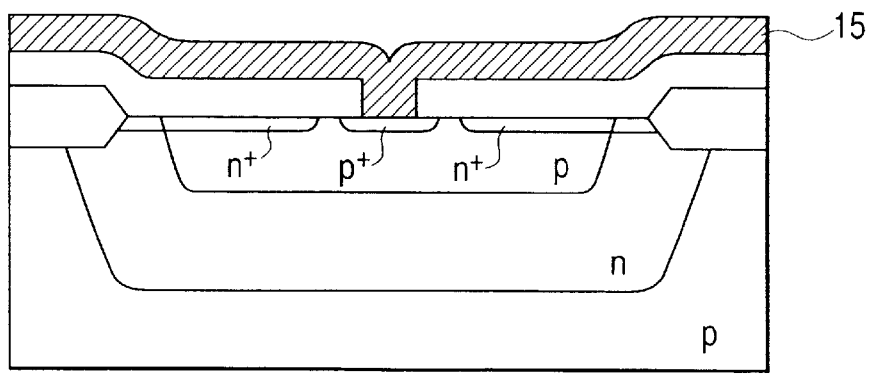
Figure 28C:
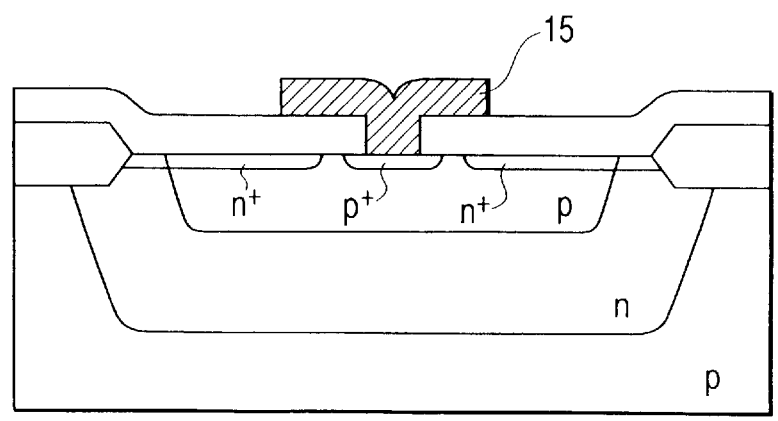
Figure 29A:
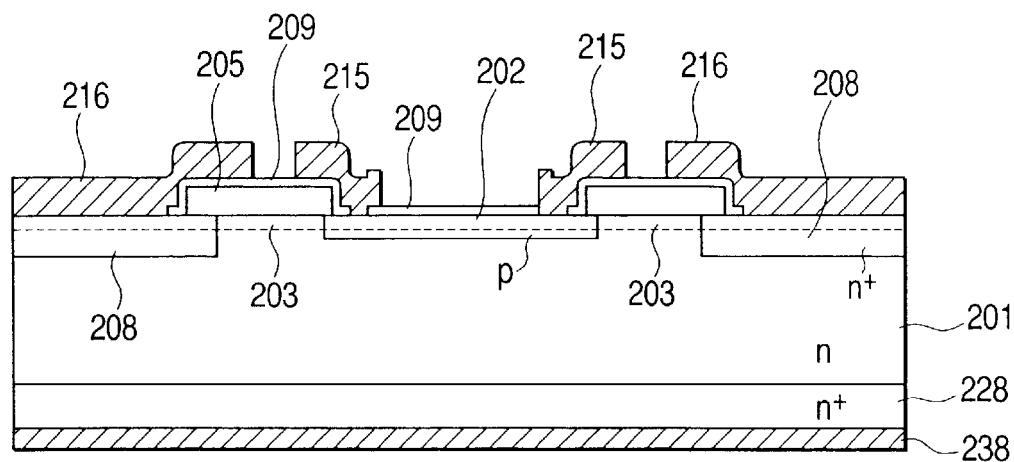
FIGS. 29A and 29B are cross-sectional views of a light-receiving element of the prior art.
Figure 29B:
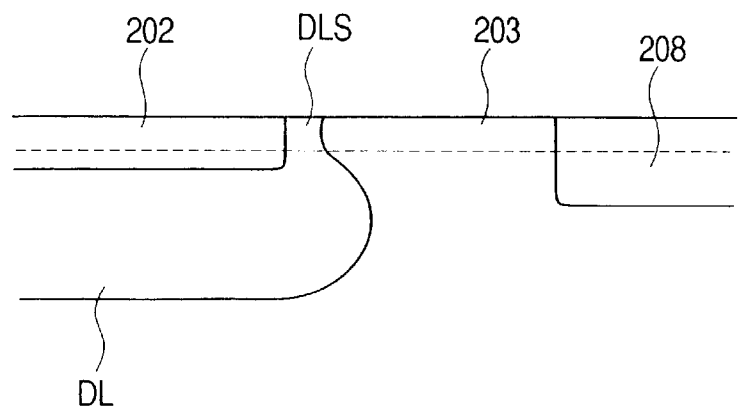
Figure 30:
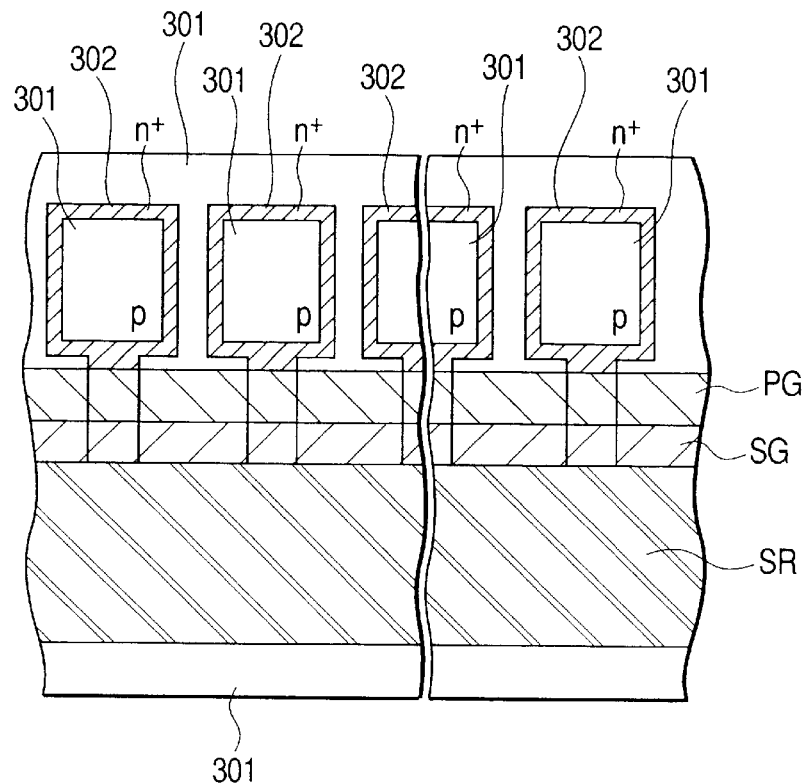
FIG. 30 is a top view of a light-receiving element of the prior art.
Figure 32:
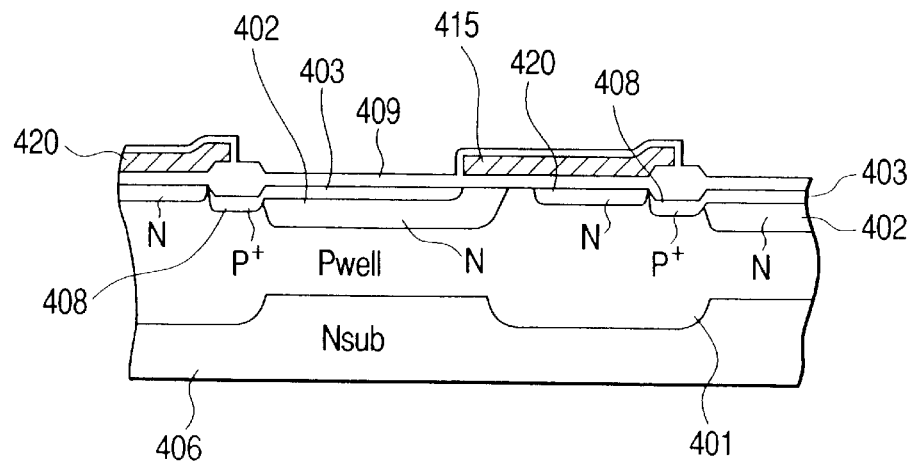
FIG. 32 is a cross-sectional view of another light-receiving element of the prior art.
Figure 31:
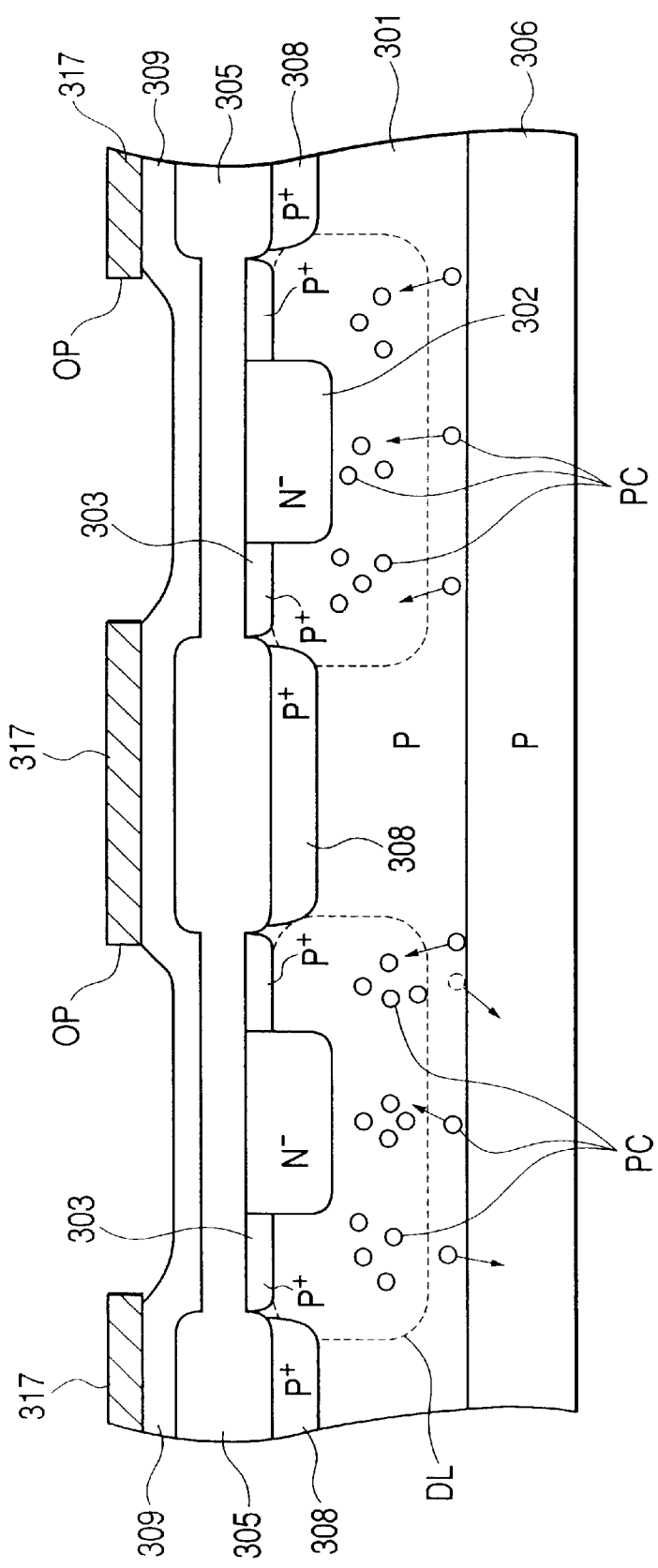
FIG. 31 is a cross-sectional view of another light-receiving element of the prior art.
Figure 33:
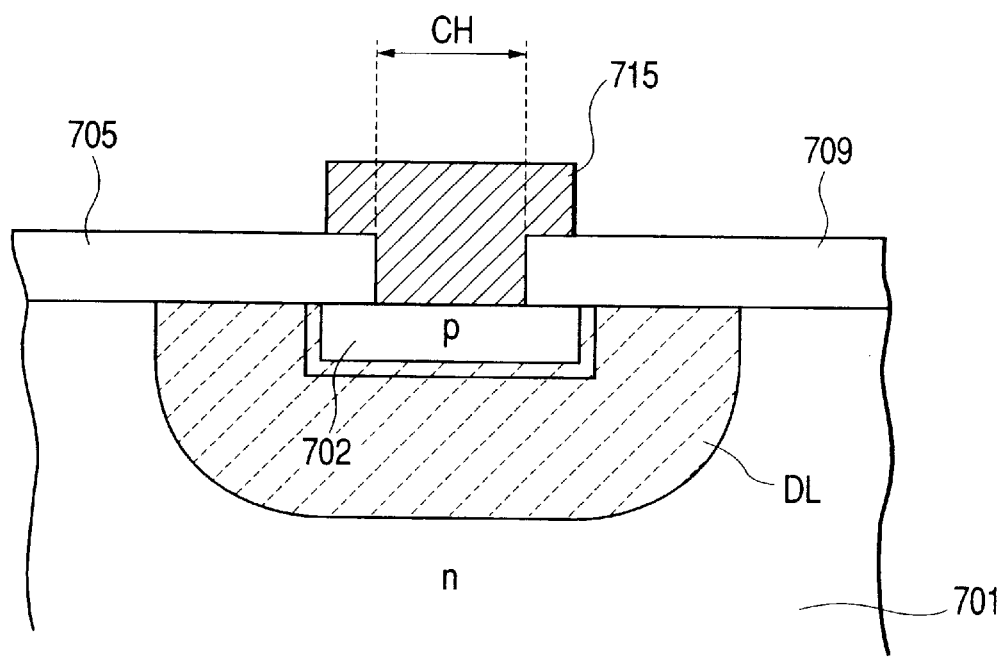
FIG. 33 is a cross-sectional view of further another light-receiving element of the prior art.

Subsequently, a layer 15 made of a conductive material such as Al—Cu, etc. is formed by sputtering or the like (see FIG. 28B). At this time, a barrier metal composed of TiN or the like may be formed below the layer 15.

Then, the layer 15 made of the conductive material is subjected to a patterning process by dry-etching using BCl$_3$, Cl$_2$, etc., whereby the layer 15 is left so that the offset portion is covered with the layer 15. In such a manner, an anode electrode 15 can be obtained.

Each of the light-receiving elements described in the above embodiments 8 to 11 can applied to the read and reset circuits shown in FIGS. 4, 7, 21 and 22, respectively.

Further, the present invention may be preferably applied to the photoelectric conversion device proposed in Japanese Patent Application Laid-Open No. 9-205588 and can be also applied to, for instance, other photoelectric conversion devices or solid image pick-up devices.

The photoelectric conversion device according to the present embodiments of the present invention is employed to produce a contact type image sensor, which is used as the image reading device of an image input system such as a facsimile machine or an image scanner. Thus, a low dark current can be realized so that a high quality image can be read. Further, the image reading device can be provided at a low cost because of its high yield.

As described above, since the light-receiving element capable of reducing the dark current can be obtained, and the photoelectric conversion device with high performance can be achieved with less unevenness of the dark current even when production process is varied. Therefore, it is possible to provide an inexpensive image reading device or an image input system capable of obtaining a high quality image.

What is claimed is:

1. A light-receiving element comprising:
   a first semiconductor region of a first conductivity type;
   a second semiconductor region of said second conductivity type, provided on said first semiconductor region;
   a third semiconductor region of said first conductivity type, provided between said second semiconductor region and an insulating film; and an electrode region of said second conductivity type, wherein said electrode region is provided in said second semiconductor region where said third semiconductor region is absent on and above said second semiconductor region, and said electrode region is connected to an anode or cathode electrode consisting of a conductor, wherein said third semiconductor region is formed so as to enclose said electrode region.

2. A light-receiving element according to claim 1, wherein said electrode region is set in a floating state to accumulate a photo-generated electric charge;

and wherein a bias voltage is applied to said first semiconductor region so as to apply a reverse bias between said first semiconductor region and said second semiconductor region.

3. A light-receiving element according to claim 1, wherein said second semiconductor region provided under said third semiconductor region is fully depleted.

4. A light-receiving element according to claim 1, wherein said electrode region is shielded from light by said anode or cathode electrode.

5. A light-receiving element according to claim 1, wherein a potential slope for moving said photo-generated electric charge towards said electrode region is formed between said electrode region and said second semiconductor region.

6. A light-receiving element according to claim 1, wherein a potential slope for moving a photo-generated electric charge towards said second semiconductor region is formed between said third semiconductor region and said second semiconductor region and between said first semiconductor region and said second semiconductor region.

7. A light-receiving element according to claim 1, wherein said anode or cathode electrode is connected to a gate of a transistor of a read circuit.

8. A light-receiving element according to claim 1, wherein said first conductivity type is N-type and said second conductivity type is P-type.

9. A light-receiving element according to claim 1, wherein said first conductivity type is P-type and said second conductivity type is N-type.

10. A light-receiving element according to claim 1, wherein an internal region of said second conductivity type is formed inside said second semiconductor region, said internal region having an impurity concentration higher than said second semiconductor region and lower than said electrode region.

11. A light-receiving element according to claim 10, wherein said internal region consists of a plurality of portions, said portions having an impurity concentration different from each other.

12. A light-receiving element comprising:

a first semiconductor region of first conductivity type;

a second semiconductor region of second conductivity type, provided on said first semiconductor region;

a third semiconductor region of said first conductivity type, provided between said second semiconductor region and an insulating film; and an electrode region of said second conductivity type, wherein said electrode region is provided in said second semiconductor region where said third semiconductor region is absent on and above said second semiconductor region, and said electrode region is connected to an anode or cathode electrode consisting of a conductor;

wherein an internal region of said second conductivity type is formed inside said second semiconductor region, said internal region having an impurity concentration higher than said second semiconductor region and lower than said electrode region; and wherein said internal region is formed so as to enclose said electrode region.

13. A light-receiving element according to claim 10, wherein said internal region is formed so as to be unevenly distributed in an opening portion formed in a light-shielding film.

14. A light-receiving element according to claim 10, wherein said internal region includes a region having a width decreased as said internal region goes away from said electrode region.

15. A light-receiving element according to claim 14, wherein each corner of said region having said decreased width has an obtuse angle.

16. A light-receiving element according to claim 10, wherein said internal region is extended from said electrode region unevenly distributed in an opening portion formed in said light-shielding film over a center of said opening portion.

17. A light-receiving element according to claim 10, wherein said internal region is formed at a shallower position than said second semiconductor region.

18. A light-receiving element according to claim 1, wherein said second semiconductor region is formed apart from an insulating film for element separation.

19. A light-receiving element according to claim 1, wherein said third semiconductor region is formed apart from said electrode region.

20. A light-receiving element according to claim 1, wherein said first semiconductor region is formed from any one of a semiconductor substrate, an epitaxial layer formed on said semiconductor substrate and a well formed in said semiconductor substrate.

21. A light-receiving element according to claim 1, wherein each corner of said second semiconductor region has an obtuse angle.

22. A light-receiving element according to claim 1, wherein said electrode region is provided so as to be distributed unevenly at one end inside said opening portion formed in said light-shielding film, and wherein a contact for applying a voltage to said first semiconductor region therethrough is provided at the other end inside said opening portion.

23. A light-receiving element according to claim 22, wherein a potential slope is formed in said second semiconductor region from the one end to the other end inside said opening portion.

24. A light-receiving element according to claim 22, wherein each corner of said second semiconductor region has an obtuse angle, and wherein each corner of said internal region formed in said second semiconductor region has an obtuse angle.

25. A light-receiving element according to claim 1, wherein a doped region having a low impurity concentration is formed between said third semiconductor region and said electrode region.

26. A light-receiving element according to claim 25, wherein said anode or cathode electrode is provided on or above said doped region.

27. A light-receiving element according to claim 1, wherein said anode or cathode electrode is provided to extend on or above a region formed between said third semiconductor region and said electrode region.

28. A light-receiving element according to claim 1, wherein said anode or cathode electrode is provided to extend on or above an interface between a depletion layer formed in a vicinity of said electrode region and an insulating film.

29. A light-receiving element according to claim 1, wherein a top surface of said second semiconductor region is covered with said anode or cathode electrode and said third semiconductor region.

30. A light-receiving element according to claim 1, wherein said anode or cathode electrode is connected to a gate of a transistor of a read circuit and a source or drain of a transistor of a reset circuit.

31. The light-receiving element according to claim 1, wherein said first semiconductor region is formed on a surface of a semiconductor substrate of a second conductivity type or in said semiconductor substrate.

* * * * *

UNITED STATES PATENT AND TRADEMARK OFFICE
CERTIFICATE OF CORRECTION

PATENT NO. : 6,590,242 B1
DATED : July 8, 2003
INVENTOR(S) : Hiraku Kozuka et al.

It is certified that error appears in the above-identified patent and that said Letters Patent is hereby corrected as shown below:

Title page,
Item [57], ABSTRACT,
Line 3, "comprises" should read -- comprised of --.

Column 2,
Line 13, "317 :a" should read -- 317: a --.
Line 18, "by to" should read -- by --.

Column 6,
Line 6, "Each of the" should read -- Each --.

Column 9,
Line 67, "$10^{16}$ cm-$^{-3}$" should read -- $10^{16}$ cm$^{-3}$ --.

Column 16,
Line 15, "formed ." should read -- formed. --.

Column 18,
Line 5, "since the" should read -- since --.
Line 8, "of" should read -- of the --.

Column 21,
Line 27, "a still" should read -- still --.

Column 22,
Line 32, "potential" should read -- potential in --.
Line 60, "(VLPD)" should read -- (V1PD) --.

Column 25,
Line 7, "that it" should read -- that --.

Column 26,
Line 29, "that it" should read -- that --.

Column 27,
Line 56, "deplation" should read -- depletion --.

UNITED STATES PATENT AND TRADEMARK OFFICE
CERTIFICATE OF CORRECTION

PATENT NO. : 6,590,242 B1
DATED : July 8, 2003
INVENTOR(S) : Hiraku Kozuka et al.

It is certified that error appears in the above-identified patent and that said Letters Patent is hereby corrected as shown below:

<u>Column 28,</u>
Line 37, "can applied" should read -- can be applied --.
Line 61, "of said second" should read -- of a second --.

Signed and Sealed this

Thirteenth Day of January, 2004

JON W. DUDAS
*Acting Director of the United States Patent and Trademark Office*